(12) United States Patent
Mori

(10) Patent No.: US 9,761,714 B2
(45) Date of Patent: Sep. 12, 2017

(54) SEMICONDUCTOR DEVICE

(71) Applicant: RENESAS ELECTRONICS CORPORATION, Kanagawa (JP)

(72) Inventor: Takahiro Mori, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/705,511

(22) Filed: May 6, 2015

(65) Prior Publication Data

US 2015/0325693 A1    Nov. 12, 2015

(30) Foreign Application Priority Data

May 9, 2014  (JP) ................................. 2014-097941

(51) Int. Cl.
*H01L 29/78*   (2006.01)
*H01L 21/28*   (2006.01)
(Continued)

(52) U.S. Cl.
CPC .... *H01L 29/7835* (2013.01); *H01L 21/28052* (2013.01); *H01L 29/0653* (2013.01); *H01L 29/0692* (2013.01); *H01L 29/0847* (2013.01); *H01L 29/0882* (2013.01); *H01L 29/408* (2013.01); *H01L 29/41758* (2013.01); *H01L 29/4238* (2013.01); *H01L 29/4933* (2013.01);
(Continued)

(58) Field of Classification Search
CPC ............. H01L 29/7835; H01L 29/4983; H01L 21/28052; H01L 29/665; H01L 29/0653; H01L 29/0692; H01L 29/4238; H01L 29/66659; H01L 29/0847; H01L 29/4933; H01L 29/0882; H01L 29/7816; H01L 29/41758; H01L 29/408; H01L 29/1083; H01L 29/1045

See application file for complete search history.

(56) References Cited

U.S. PATENT DOCUMENTS

2009/0256199 A1* 10/2009 Denison .............. H01L 29/0653
                                                                 257/343
2012/0043608 A1    2/2012  Yang et al.

OTHER PUBLICATIONS

J. Jang et al., "Interdigitated LDMOS", ISPSD 2013 The 25th International Symposium on Power Semiconductor Devices and ICs, LV-P8, pp. 245-248.
(Continued)

*Primary Examiner* — Cuong Q Nguyen
*Assistant Examiner* — Nishath Yasmeen
(74) *Attorney, Agent, or Firm* — McDermott Will & Emery LLP

(57) ABSTRACT

A field oxide film lies extending from the underpart of a gate electrode to a drain region. A plurality of projection parts projects from the side face of the gate electrode from a source region side toward a drain region side. The projection parts are arranged side by side along a second direction (direction orthogonal to a first direction along which the source region and the drain region are laid) in plan view. A plurality of openings is formed in the field oxide film. Each of the openings is located between projection parts adjacent to each other when seen from the first direction. The edge of the opening on the drain region side is located closer to the source region than the drain region. The edge of the opening on the source region side is located closer to the drain region than the side face of the gate electrode.

11 Claims, 31 Drawing Sheets

(51) Int. Cl.
*H01L 29/06* (2006.01)
*H01L 29/08* (2006.01)
*H01L 29/40* (2006.01)
*H01L 29/417* (2006.01)
*H01L 29/423* (2006.01)
*H01L 29/49* (2006.01)
*H01L 29/66* (2006.01)
*H01L 29/10* (2006.01)

(52) U.S. Cl.
CPC ........ *H01L 29/4983* (2013.01); *H01L 29/665* (2013.01); *H01L 29/66659* (2013.01); *H01L 29/7816* (2013.01); *H01L 29/1045* (2013.01); *H01L 29/1083* (2013.01)

(56) References Cited

OTHER PUBLICATIONS

Office Action issued in corresponding Japanese Patent Application No. 2014-097941, dated Jul. 4, 2017.

\* cited by examiner

SEMICONDUCTOR DEVICE

CROSS-REFERENCE TO RELATED APPLICATION

The disclosure of Japanese Patent Application No. 2014-097941 filed on May 9, 2014 including the specification, drawings and abstract is incorporated herein by reference in its entirety.

BACKGROUND

The present invention relates to a semiconductor device, and is a technology, for example, applicable to a power device.

As an electronic element that controls a high voltage and a large current, presently, a power device is used. As one of power devices, there is an LDMOS (Laterally Diffused Metal Oxide Semiconductor). In the LDMOS, generally, a gate electrode and a drain region are spaced apart from each other in plan view. Further, a field insulating film is formed between the gate electrode and the drain region.

Further, presently, as the structure of the LDMOS, structures described in US Patent Application Publication No. 2012/0043608 (Patent document 1) or J. Jang, K.-H. Cho, D. Jang, M. Kim, C. Yoon, J. Park, H. Oh, C. Kim, H. Ko, K. Lee and S. Yi, "Interdigitated LDMOS", ISPSD 2013 The 25th International Symposium on Power Semiconductor Devices and ICs, LV-P8 (Non-Patent document 1) are proposed. In Patent document 1 and Non-Patent document 1, field insulating films formed on the side face of the drain region in a comb-tooth-shape in plan view project from the drain region side toward the gate electrode side. Furthermore, the LDMOS described in Non-Patent document 1 has a plurality of projection parts projecting from the side face of the gate electrode from the source region side toward the drain region side. Each of the projection parts is provided corresponding to each of a plurality of comb teeth of the field insulating film, and at least a part of each of the projection parts lies over each of the field insulating films.

SUMMARY

Generally, for the LDMOS, a high breakdown voltage and a low ON-resistance are demanded strongly. The present inventor examined an LDMOS having a structure that reduces ON-resistance between a source region and a drain region while increasing a breakdown voltage between a gate electrode and the drain region. The other objects and the new feature will become clear from the description of the present specification and the accompanying drawings.

According to an embodiment, the field insulating film lies extending from the underpart of the gate electrode to the drain region. Further, a plurality of projection parts projects from the side face of the gate electrode from the source region side toward the drain region side. A plurality of projection parts is arranged side by side along a second direction (the direction orthogonal to a first direction along which the source region and the drain region are laid) in plan view. Furthermore, a plurality of openings is formed in the field insulating film. Each opening is located between projection parts adjacent to each other when seen from the first direction. Further, the openings are arranged side by side alternately with the projection parts along the second direction. An edge of the opening on the drain region side is connected to the drain region, or located closer to the source region than the drain region. On the other hand, the edge of the opening on the source region side is located closer to the drain region than the above-described side face of the gate electrode.

According to the embodiment, there is provided an LDMOS that realizes low ON-resistance while realizing a high breakdown voltage.

DETAILED DESCRIPTION

Hereinafter, an embodiment will be explained using the drawings. Meanwhile, in all the drawings, the same sign will be given to the same constituent element and the explanation will appropriately be omitted.

Figure 1:
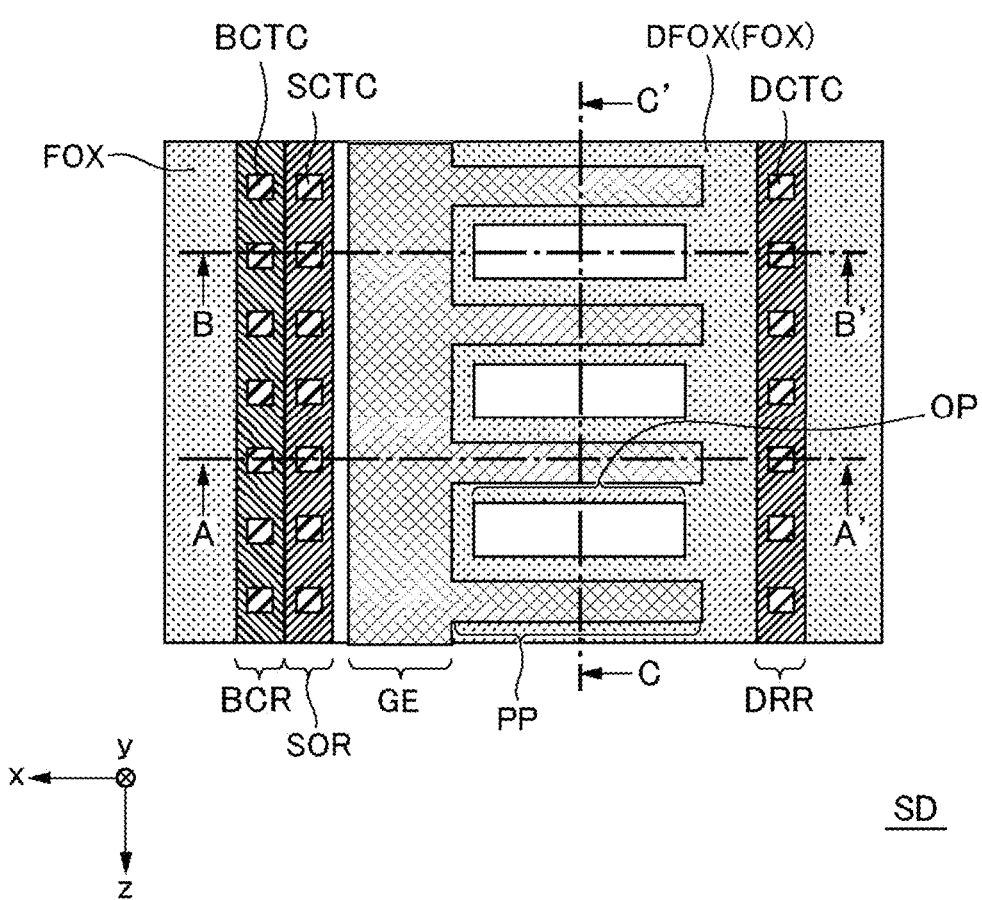
FIG. 1 is a plan view showing a semiconductor device according to an embodiment.
Figure 2:
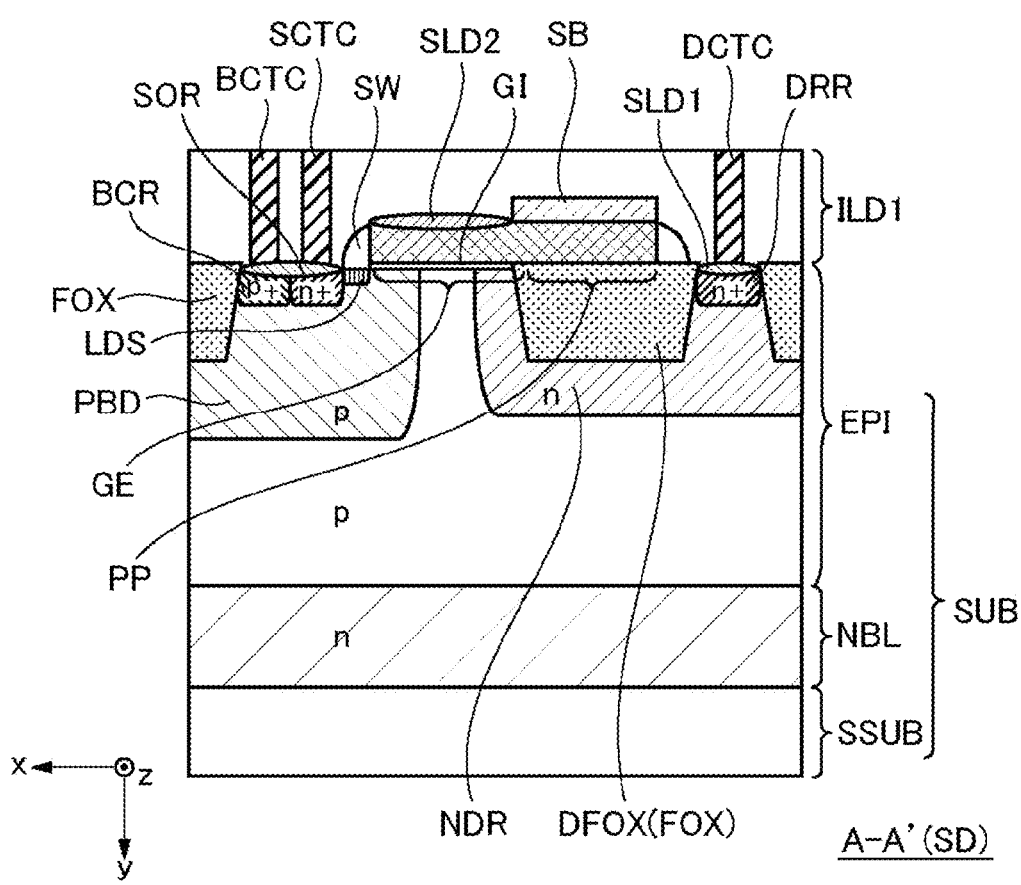
FIG. 2 is an A-A' cross-sectional view in FIG. 1.
Figure 3:
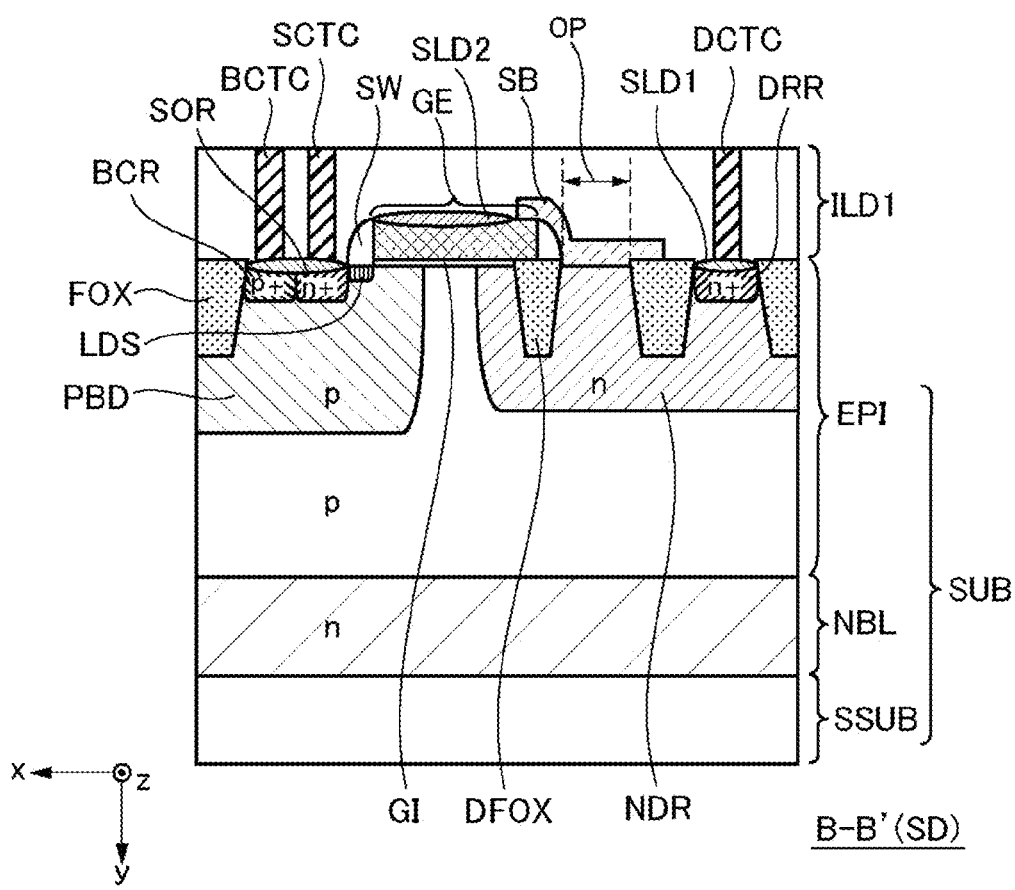
FIG. 3 is a B-B' cross-sectional view in FIG. 1.
Figure 4:
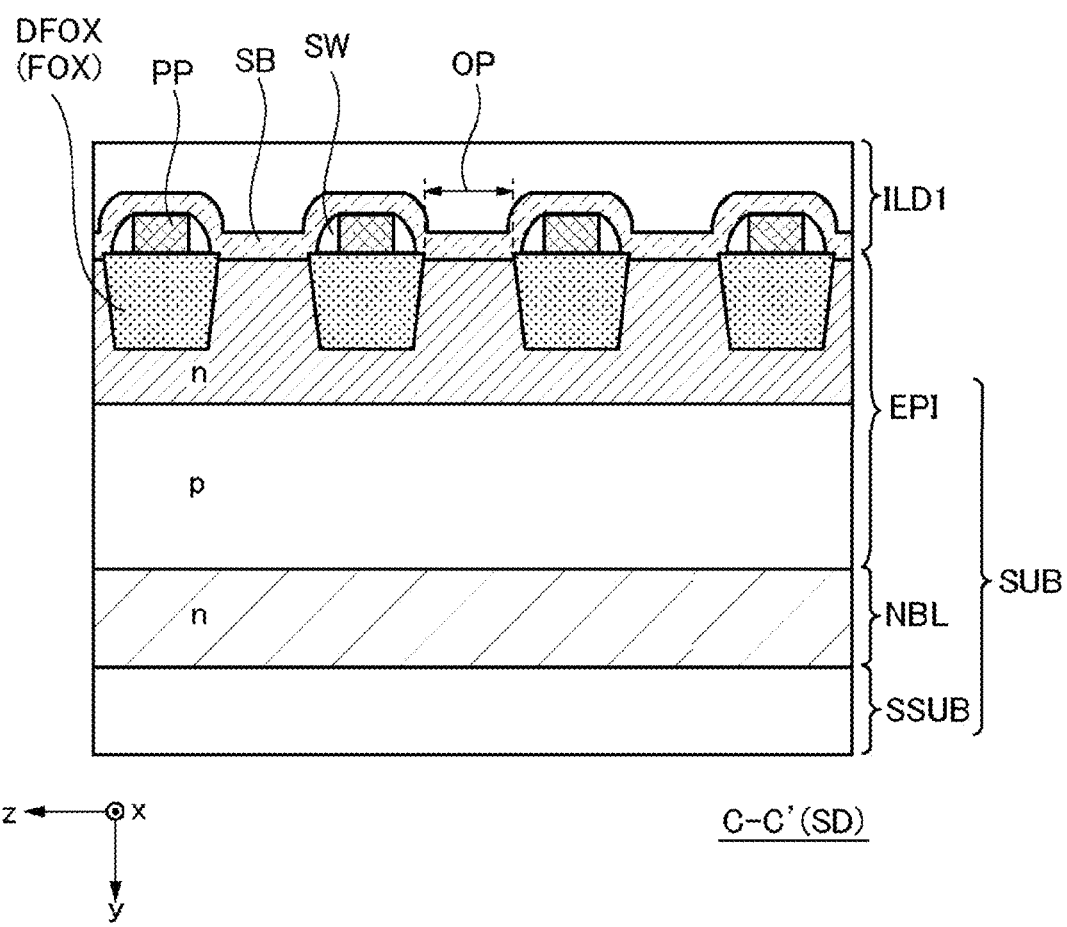
FIG. 4 is a C-C' cross-sectional view in FIG. 1.

FIG. 1 is a plan view showing a semiconductor device SD according to an embodiment. FIG. 2 is an A-A' cross-sectional view in FIG. 1. FIG. 3 is a B-B' cross-sectional view in FIG. 1. FIG. 4 is a C-C' cross-sectional view in FIG. 1. The semiconductor device SD includes a substrate SUB, an epitaxial layer EPI (a semiconductor layer), a first-conductivity type body region PBD (a first-conductivity type region), a second-conductivity type drift region NDR (a second-conductivity type region), a gate electrode GE, a source region SOR, a drain region DRR, a field oxide film DFOX (a field insulating film), a plurality of projection parts PP, and a plurality of openings OP.

The epitaxial layer EPI is formed in the substrate SUB. The first-conductivity type body region PBD is formed in the epitaxial layer EPI. The second-conductivity type drift region NDR is formed in the epitaxial layer EPI. Further, the second-conductivity type drift region NDR is arranged side by side with the first-conductivity type body region PBD in the first direction (in the drawing, the x-axis direction) in plan view. The gate electrode GE lies over the epitaxial layer EPI. Further, the gate electrode GE is formed extending from the first-conductivity type body region PBD to the second-conductivity type drift region NDR in plan view. Furthermore, the gate electrode GE extends in a second direction (in the drawing, the z-axis direction orthogonal to the x-axis direction) orthogonal to the first direction in plan view. The source region SOR is formed in the first-conductivity type body region PBD. The drain region DRR is formed in the second-conductivity type drift region NDR. Further, the drain region DRR is spaced apart from the gate electrode GE in plan view. The field oxide film DFOX is formed in the surface layer of the second-conductivity type drift region NDR. Further, the field oxide film DFOX lies extending from the underpart of the gate electrode GE to the drain region DRR. The projection parts PP project from the side face of the gate electrode GE from the source region SOR side toward the drain region DRR side. Further, the projection parts PP are arranged side by side along the second direction in plan view. The openings OP are formed in the field oxide film DFOX. Each of the openings OP is located between the projection parts PP adjacent to each other when seen from the first direction. Further, the openings OP are arranged side by side alternately with the projection parts PP along the second direction. The edge of the opening OP on the drain region DRR side lies closer to the source region SOR than the drain region DRR. On the other hand, the edge of the opening OP on the source region SOR side lies closer to the drain region DRR than the above-described side face of the gate electrode GE. Hereinafter, detailed explanation will be given.

Meanwhile, the first-conductivity type and the second-conductivity type may be any of a p-type and an n-type, when each other's conductivity types are contrary. Hereinafter, explanation will be given assuming that the first-conductivity type is the p-type and the second-conductivity type is the n-type.

The substrate SUB includes a semiconductor substrate SSUB, an epitaxial layer EPI, and a second-conductivity type buried region NBL. The epitaxial layer EPI is formed over the semiconductor substrate SSUB. In the embodiment, the conductivity type of the epitaxial layer EPI is the first-conductivity type (the p-type). Further, the second-conductivity type buried region NBL is buried between the semiconductor substrate SSUB and the epitaxial layer EPI. Meanwhile, the semiconductor substrate SSUB is, for example, a p-type silicon substrate.

The substrate SUB is manufactured, for example, as follows. First, impurities are implanted to the surface of the semiconductor substrate SSUB. Subsequently, the semiconductor substrate SSUB is heated. Consequently, the impurity diffuses into the inside of the semiconductor substrate SSUB. Subsequently, the epitaxial layer EPI is formed over the semiconductor substrate SSUB by epitaxial growth. Subsequently, the semiconductor substrate SSUB and the epitaxial layer EPI are heated. Consequently, a part of the impurity in the semiconductor substrate SSUB diffuses into the epitaxial layer EPI. In this way, the second-conductivity type buried region NBL is formed extending from the semiconductor substrate SSUB to the epitaxial layer EPI.

In the surface layer of the epitaxial layer EPI, a field oxide film FOX (an inter-element separation layer) is formed partially. The field oxide film FOX is formed, for example, by STI (Shallow Trench Isolation) or LOCOS (Local Oxidation of Silicon). The field oxide film FOX surrounds the region in which an element (in the embodiment, an LDMOS) is to be formed, and isolates the region from outside regions. Furthermore, a part of the field oxide film FOX becomes a field oxide film DFOX in the second-conductivity type drift region NDR.

In the epitaxial layer EPI, the first-conductivity type body region PBD and the second-conductivity type drift region NDR are formed. In the example shown in the drawing, the first-conductivity type body region PBD and the second-conductivity type drift region NDR face each other with a space in the first direction (in the drawing, the x-axis direction) in plan view. However, the first-conductivity type body region PBD and the second-conductivity type drift region NDR may be in contact with each other in plan view.

Over the surface of the epitaxial layer EPI, the gate electrode GE is formed extending from the first-conductivity type body region PBD to the second-conductivity type drift region NDR in plan view. Further, the gate electrode GE extends in the second direction (in the drawing, the z-axis direction) in plan view. The gate electrode GE is formed, for example, from polysilicon.

For the gate electrode GE, the projection parts PP are formed. Further, the projection part PP is formed integrally with the gate electrode GE. Consequently, a voltage same as that applied to the gate electrode GE can be applied to the projection part PP. Specifically, the projection parts PP project from the side face of the gate electrode GE from the first-conductivity type body region PBD side toward the second-conductivity type drift region NDR side. This plurality of projection parts PP is arranged side by side at even intervals along the second direction (in the drawing, the z-axis direction) in plan view. However, the interval between projection parts PP adjacent to each other may be different depending on regions.

Meanwhile, for the side face of the gate electrode GE and the projection part PP, a sidewall SW is formed. The sidewall SW is formed, for example, from a silicon oxide film ($SiO_2$), a silicon nitride film (SiN) or a silicon oxynitride film (SiON), or a stacked film thereof.

In the first-conductivity type body region PBD, an LDS (Lightly-Doped Source) region LDS, a source region SOR, and a body contact region BCR are formed. The LDS region LDS is a second-conductivity type (the n-type) region. The source region SOR is an n+ region (the second-conductivity type region), and the impurity concentration therein is higher than that in the LDS region LDS. The body contact region BCR is a p+ region (the first-conductivity type region), and the impurity concentration therein is higher than that in the first-conductivity type body region PBD.

The LDS region LDS, the source region SOR and the body contact region BCR are arranged side by side in this order in the direction from the second-conductivity type drift region NDR side toward the first-conductivity type body region PBD side, and are adjacent to each other. Further, the LDS region LDS, the source region SOR and the body contact region BCR extend in the second direction (in the drawing, the z-axis direction) in plan view.

More specifically, the LDS region LDS is adjacent to the side face of the gate electrode GE on the first-conductivity type body region PBD side in plan view, and lies below the sidewall SW. Meanwhile, the LDS region LDS may extend to a region in which a part thereof overlaps, in plan view, the gate electrode GE. The source region SOR is adjacent to the sidewall SW of the gate electrode GE on the first-conductivity type body region PBD side in plan view. The body contact region BCR faces the LDS region LDS via the source region SOR in plan view. Further, on the opposite side of the source region SOR via the body contact region BCR, the field oxide film FOX extends in the second direction (in the drawing, the z-axis direction). The field oxide film FOX is in contact with the body contact region BCR.

In the second-conductivity type drift region NDR, the drain region DRR is formed. The drain region DRR is an n+ region (the second-conductivity type region), and the impurity concentration therein is higher than that in the second-conductivity type drift region NDR. The drain region DRR extends in the second direction (in the drawing, the z-axis direction) in plan view. Furthermore, the drain region DRR is spaced apart from the gate electrode GE in the first direction (in the drawing, the x-axis direction) in plan view.

More specifically, in the second-conductivity type drift region NDR, the field oxide film FOX is formed. Further, on the opposite side of the gate electrode GE via the projection parts PP, an opening passing through the field oxide film FOX in the thickness direction of the substrate SUB extends in the second direction (in the drawing, the z-axis direction). Further, the drain region DRR lies in the region in which the opening is formed.

In the second-conductivity type drift region NDR, the field oxide film DFOX (a part of the field oxide film FOX) is formed extending from the underpart of the gate electrode GE to the drain region DRR. Meanwhile, the bottom part of the field oxide film DFOX lies in a place deeper than the bottom part of the drain region DRR.

It is so configured that the projection part PP of the gate electrode GE is positioned over the field oxide film DFOX. Further, a voltage same as that applied to the gate electrode GE is applied to the projection part PP. Consequently, the projection part PP functions as a field plate. In other words, the electric field between the gate electrode GE and the drain region DRR is also formed between the projection part PP and the drain region DRR. Consequently, the concentration of the electric field at the edge of the gate electrode GE on the drain region DRR side is suppressed. In this way, the breakdown voltage between the gate electrode GE and the drain region DRR side becomes high.

Between the gate electrode GE and the epitaxial layer EPI, a gate insulating film GI is formed. In other words, the gate insulating film GI is formed so as to extend over the first-conductivity type body region PBD and the second-conductivity type drift region NDR. The gate insulating film GI is formed, for example, from a silicon oxide film ($SiO_2$).

In the field oxide film DFOX, a plurality of openings OP is formed. The opening OP passes through the field oxide film DFOX in the thickness direction of the substrate SUB. In the opening OP, the field oxide film DFOX is not formed, and the second-conductivity type drift region NDR lies. In the example shown in the drawing, the planar shape of the opening OP is rectangular. However, the planar shape of the opening OP is not limited to this.

The openings OP are arranged side by side alternately with the projection parts PP along the second direction (in the drawing, the z-axis direction). Further, the edge of the opening OP on the drain region DRR side lies closer to the source region SOR than the drain region DRR. On the other hand, the edge of the opening OP on the source region SOR side lies closer to the drain region DRR than the side face of the gate electrode GE on the drain region DRR side (the side face on which the projection part PP is formed). In other words, the opening OP is configured so that both the edge on the source region SOR side and the edge on the drain region DRR side do not go through the field oxide film. DFOX. On this occasion, the gate electrode GE is so configured that the entire edge on the drain region DRR side rises on the field oxide film DFOX. Meanwhile, in the example shown in the drawing, the edge of the opening OP on the drain region DRR side lies closer to the source region SOR than the tip end of the projection part PP.

Meanwhile, the opening OP is covered with a silicide block film SB (for example, a silicon oxide film ($SiO_2$)) formed extending over the projection parts PP. Further, in the surface of the second-conductivity type drift region NDR, on the surface of the region in which the opening OP is formed, a region in which impurities are doped in a high concentration (for example, such a region as the drain region DRR) is not formed.

A silicide film SLD1 is formed on the surfaces of the source region SOR, the body contact region BCR and the drain region DRR. Similarly, a silicide film SLD2 is formed on the surface of the gate electrode GE. Silicide films SLD1, SLD2 are formed, for example, from nickel (Ni). Meanwhile, the opening OP is covered with the silicide block film SB. Consequently, in the surface of the second-conductivity type drift region NDR, on the surface of the region in which the opening OP is formed, no silicide film is formed.

Over the surface of the substrate SUB, an interlayer insulating film ILD1 is provided. The interlayer insulating film ILD1 covers the surface of the substrate SUB (for example, gate electrode GE). A plurality of contacts BCTC, a plurality of contacts SCTC, and a plurality of contacts DCTC are connected to the body contact region BCR, the source region SOR and the drain region DRR, respectively. These contacts BCTC, SCTC, DCTC are formed in a connection hole passing through the interlayer insulating film ILD1.

The contacts BCTC are arranged in a line along the second direction (in the drawing, the z-axis direction) in plan view. Similarly, the contacts SCTC are also arranged in a line along the second direction in plan view, and the contacts DCTC are also arranged in a line along the second direction in plan view. Furthermore, each of the contacts BCTC, SCTC, DCTC is arranged in a line along the first direction (in the drawing, the x-axis direction), with the openings OP or the projection parts PP. Further, it is so configured that one line in which the contacts BCTC, SCTC, DCTC and the projection parts PP are arranged side by side along the first direction is provided along the second direction, repeating alternately with one line in which the contacts BCTC, SCTC, DCTC and the openings OP are arranged side by side along the first direction.

Next, a method for manufacturing the semiconductor device SD shown in FIGS. 1 to 4 will be explained. FIGS. 5 to 13 are drawings for explaining a method for manufacturing the semiconductor device SD shown in FIGS. 1 to 4.

Figure 5:
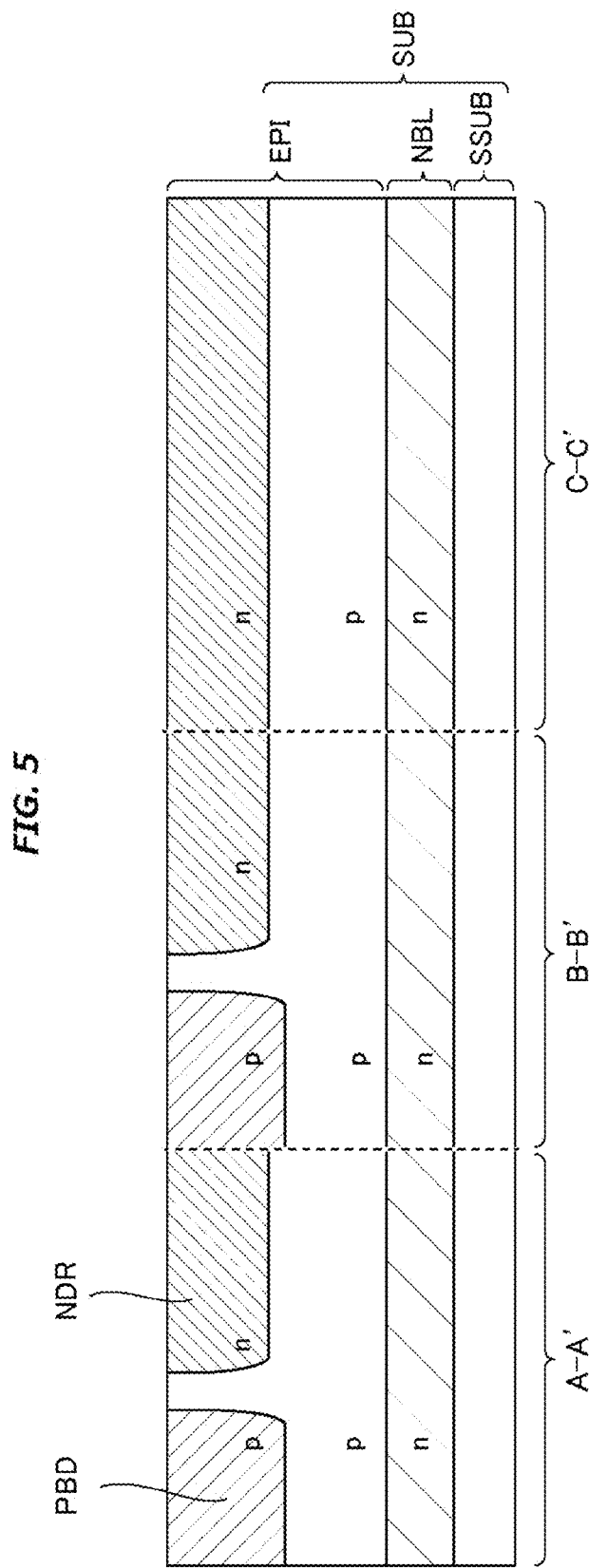
FIG. 5 is a drawing for explaining a method for manufacturing the semiconductor device shown in FIGS. 1 to 4.

First, as shown in FIG. 5, in the surface of the substrate SUB (the epitaxial layer EPI), the first-conductivity type body region PBD and the second-conductivity type drift region NDR are formed, for example, by ion implantation. Meanwhile, the method for manufacturing the substrate SUB is as described above.

Figure 6:
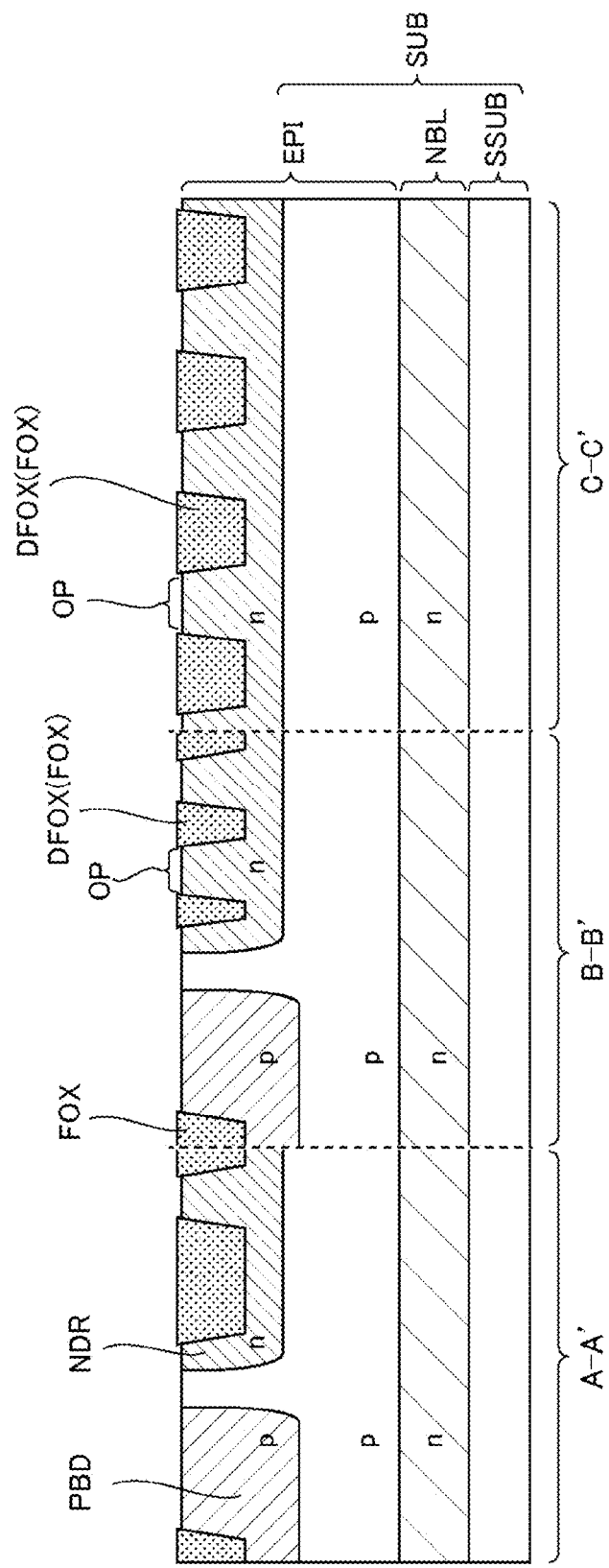
FIG. 6 is a drawing for explaining a method for manufacturing the semiconductor device shown in FIGS. 1 to 4.

Subsequently, as shown in FIG. 6, in the surface layer of the epitaxial layer EPI, the field oxide film FOX is formed by STI. The field oxide film FOX isolates a region in which an element (in the embodiment, an LDMOS) is to be formed from outside regions, and becomes the field oxide film DFOX in a part of the region of the second-conductivity type drift region NDR. Furthermore in this case, in the region of the field oxide film DFOX in which the opening OP is formed, a trench for STI is not formed. Consequently, the field oxide film FOX is not formed in the region. Therefore, the field oxide film DFOX has the opening OP.

Figure 7:
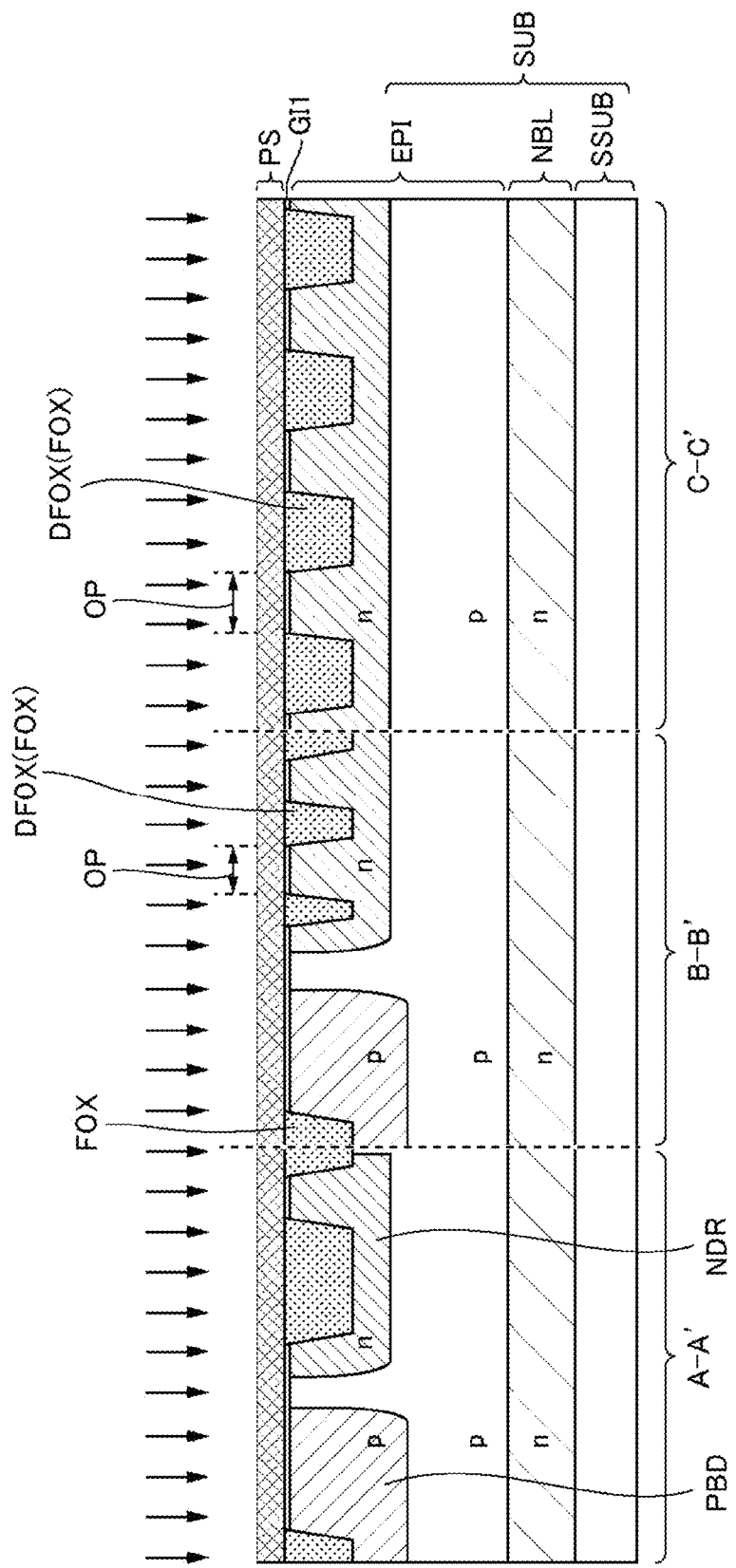
FIG. 7 is a drawing for explaining a method for manufacturing the semiconductor device shown in FIGS. 1 to 4.

Subsequently, as shown in FIG. 7, the insulating film GI1 and the polysilicon film PS are formed in this order over the surface of the substrate SUB. The insulating film GI1 is an insulating film to be the gate insulating film GI. The polysilicon film PS is a conductive film to be the gate electrode GE and the projection part PP. Subsequently, impurities are implanted into the polysilicon film PS.

Figure 8:
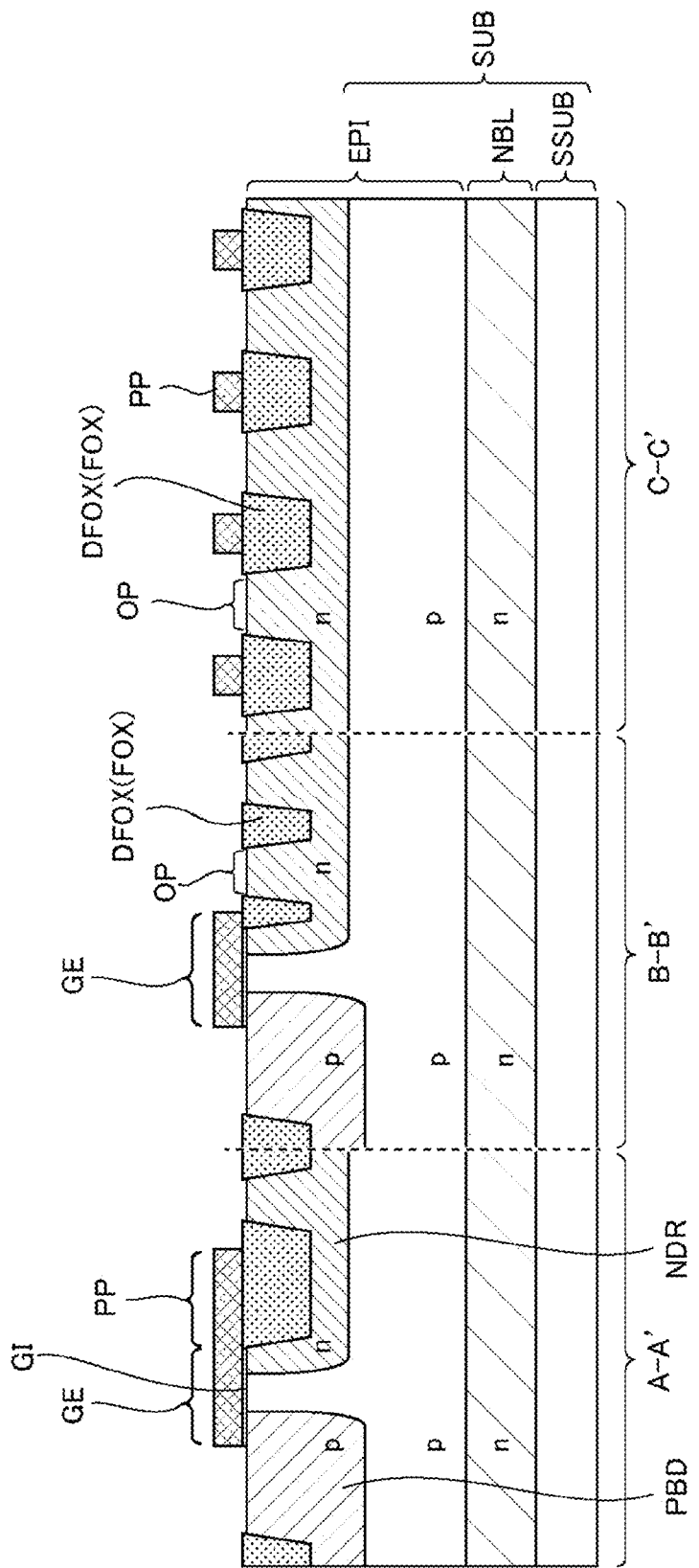
FIG. 8 is a drawing for explaining a method for manufacturing the semiconductor device shown in FIGS. 1 to 4.

Subsequently, as shown in FIG. 8, the insulating film GI1 and the polysilicon film PS are patterned. Consequently, the gate insulating film GI, the gate electrode GE and the projection parts PP are formed.

Figure 9:
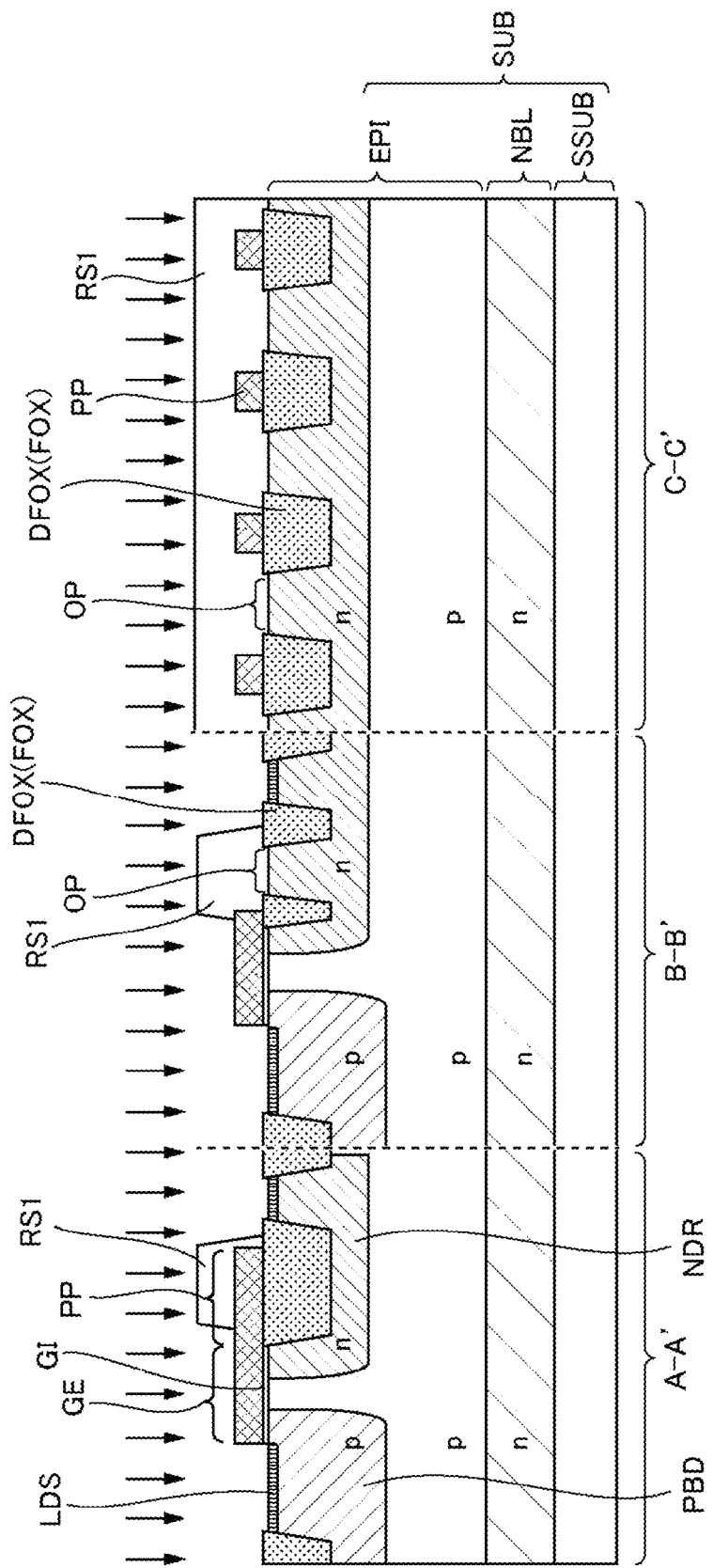
FIG. 9 is a drawing for explaining a method for manufacturing the semiconductor device shown in FIGS. 1 to 4.

Subsequently, as shown in FIG. 9, a resist film RS1 is formed over the surface of the epitaxial layer EPI. The resist film RS1 covers the opening OP extending over the projection parts PP. Subsequently, impurities of the second-conductivity type (for example, phosphorus (P)) are implanted into the epitaxial layer EPI. Consequently, the LDS region LDS (the second-conductivity type region) is formed using the gate electrode GE and the resist film RS1 as a mask.

Figure 10:
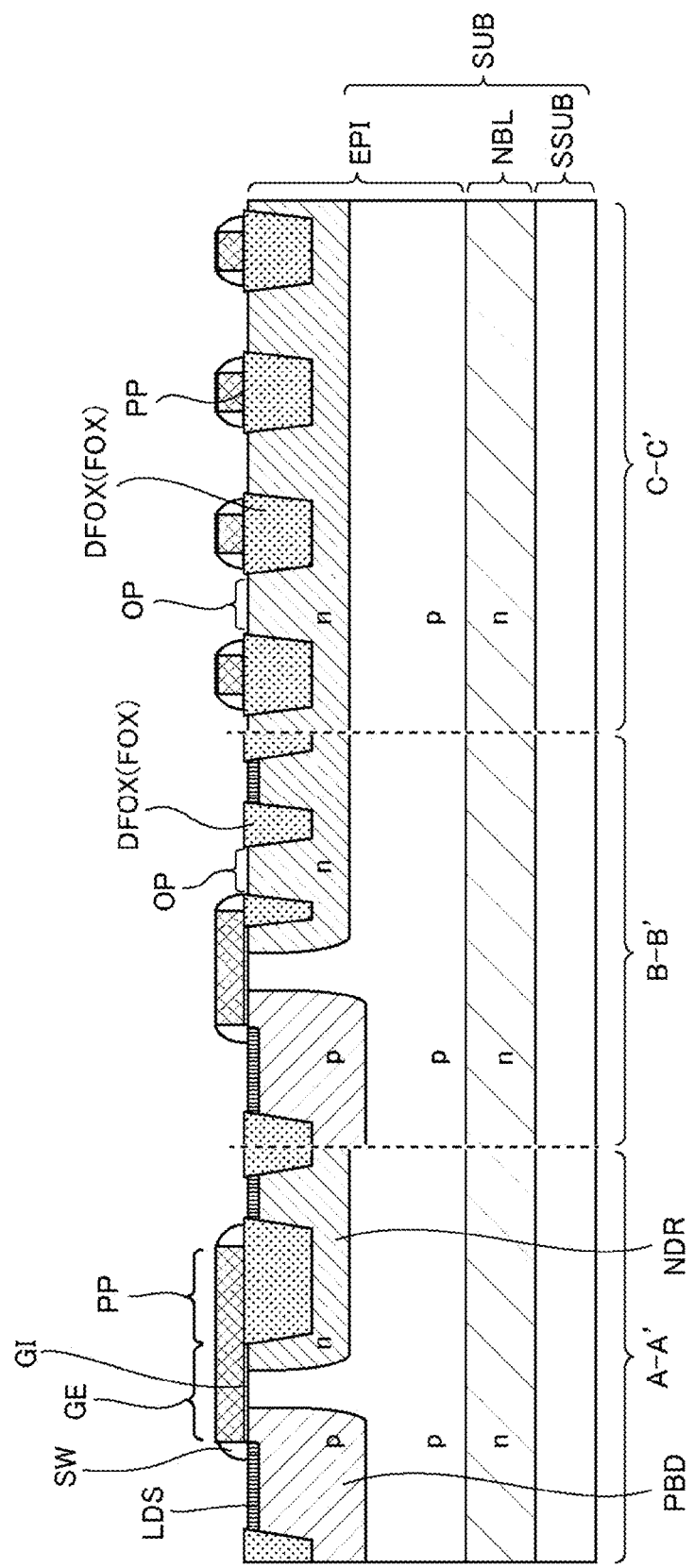
FIG. 10 is a drawing for explaining a method for manufacturing the semiconductor device shown in FIGS. 1 to 4.

Subsequently, as shown in FIG. 10, the sidewall SW is formed on the side face of the gate electrode GE and the projection part PP. Specifically, an insulating film covering the gate electrode GE and the projection part PP is formed. Subsequently, the insulating film is etched-back. Consequently, the sidewall SW is formed.

Figure 11:
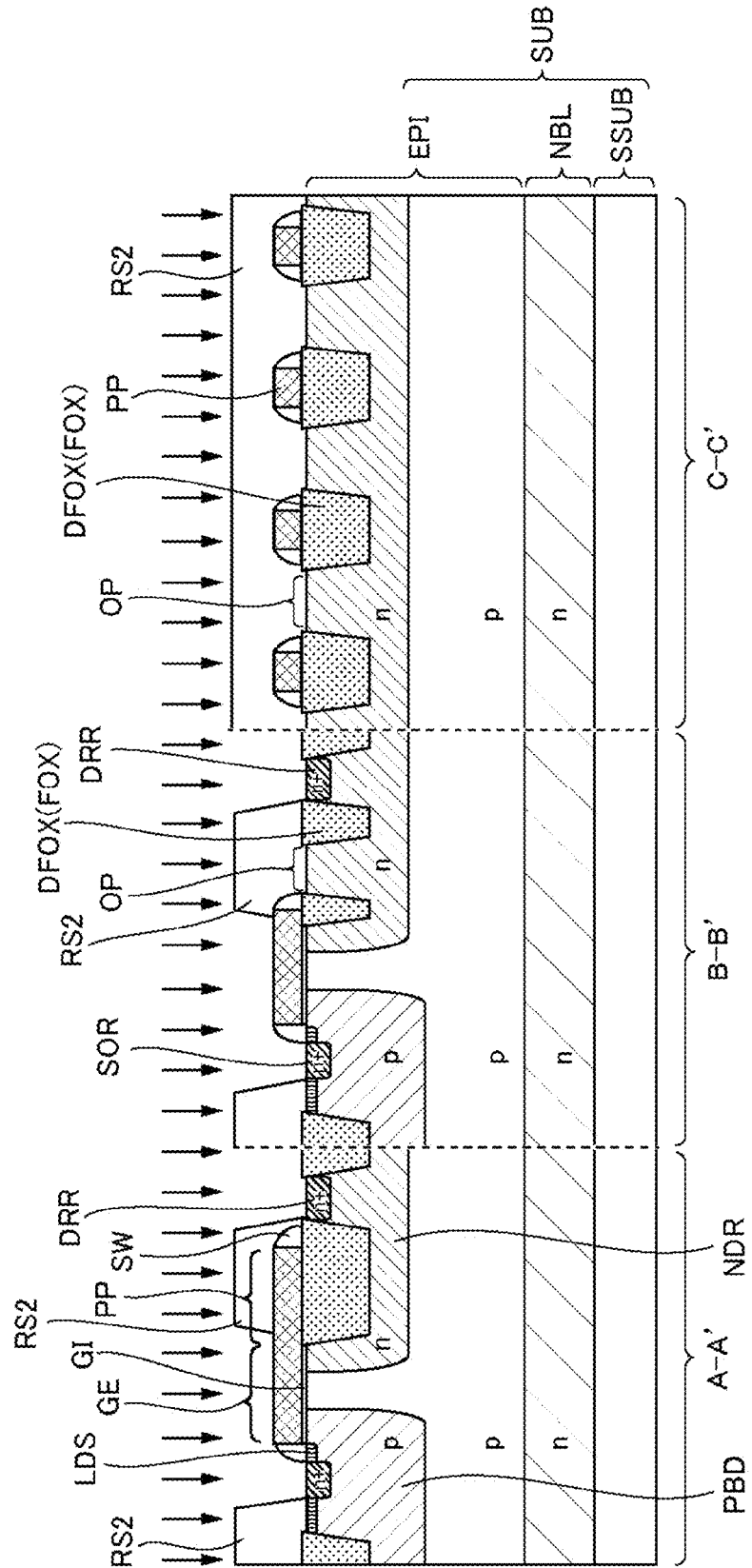
FIG. 11 is a drawing for explaining a method for manufacturing the semiconductor device shown in FIGS. 1 to 4.

Subsequently, as shown in FIG. 11, a resist film RS2 is formed over the surface of the epitaxial layer EPI. The resist film RS2 covers the opening OP, while extending over the projection parts PP. Furthermore, the resist film RS2 also covers a region in which the body contact region BCR is to be formed in a subsequent step. Subsequently, impurities of the second-conductivity type (for example, phosphorus (P)) are implanted into the epitaxial layer EPI. Consequently, the source region SOR and the drain region DRR are formed using the gate electrode GE and the resist film RS2 as a mask.

Figure 12:
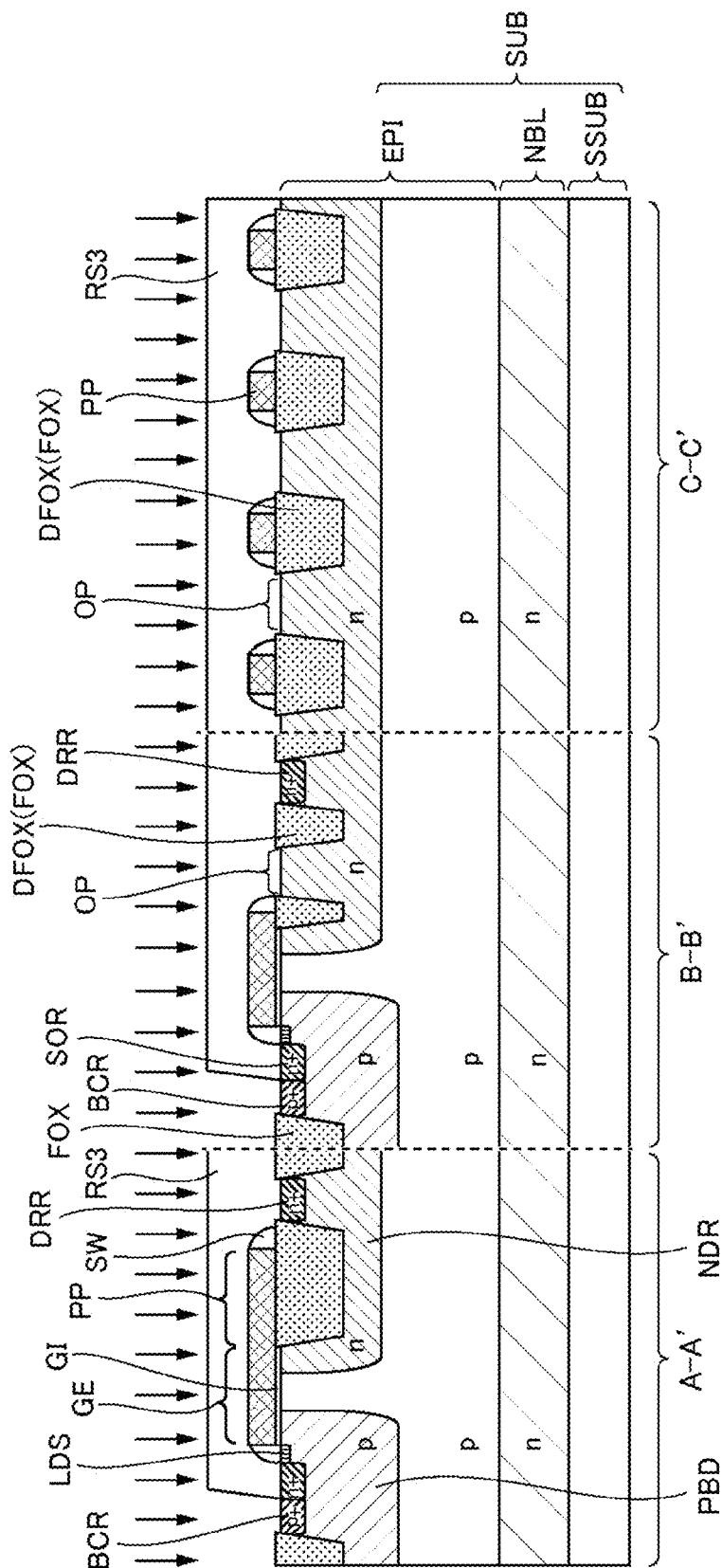
FIG. 12 is a drawing for explaining a method for manufacturing the semiconductor device shown in FIGS. 1 to 4.

Subsequently, as shown in FIG. 12, a resist film RS3 is formed over the surface of the epitaxial layer EPI. The resist film RS3 covers the second-conductivity type drift region NDR (including the opening OP), the gate electrode GE and the source region SOR. Subsequently, impurities of the first-conductivity type (for example, boron (B)) are implanted into the epitaxial layer EPI. Consequently, the body contact region BCR is formed using the resist film RS3 as a mask.

Figure 13:
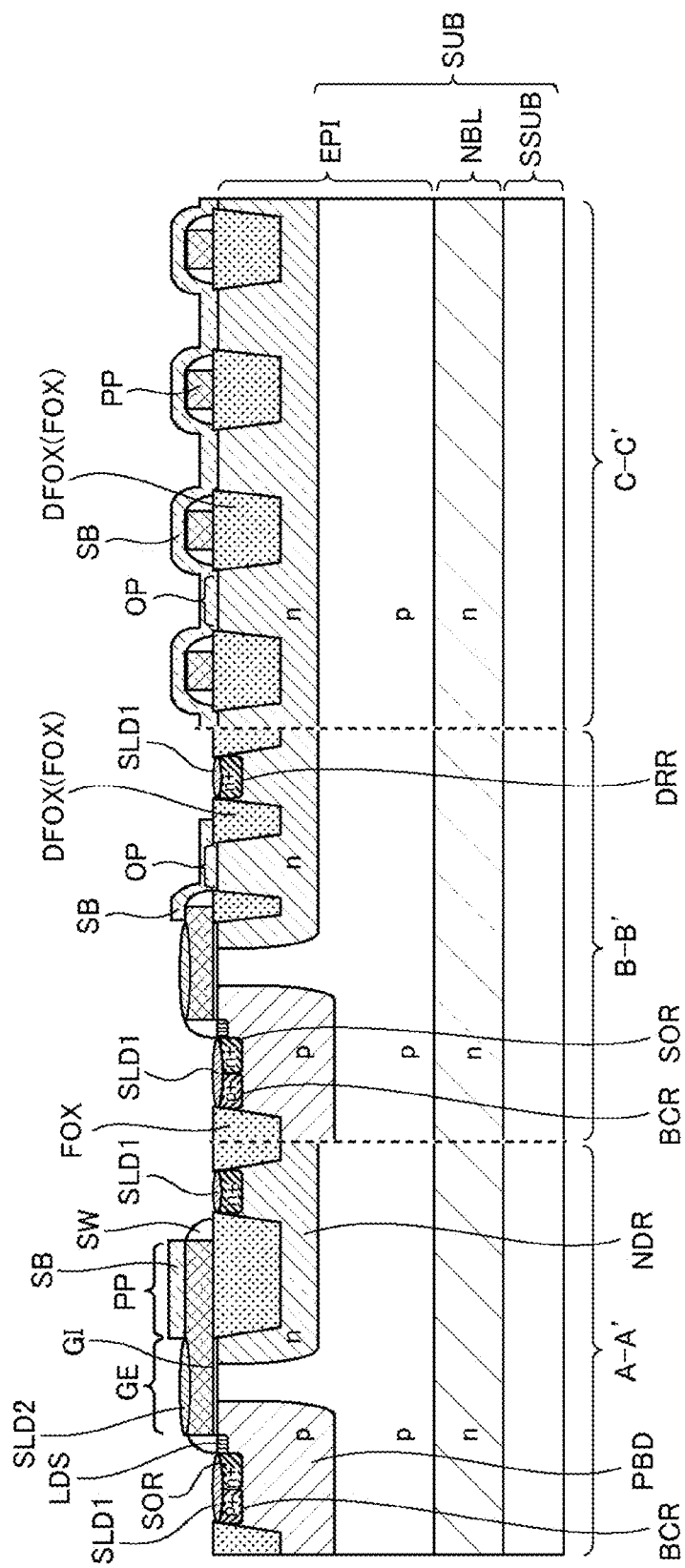
FIG. 13 is a drawing for explaining a method for manufacturing the semiconductor device shown in FIGS. 1 to 4.

Subsequently, as shown in FIG. 13, the silicide block film SB is formed. The silicide block film SB covers the opening OP, while extending over the projection parts PP. Subsequently, a metal film (for example, nickel (Ni)) is formed on the surface of the substrate SUB. Subsequently, the substrate SUB is heated. Consequently, silicide films SLD1, SLD2 are formed. Meanwhile, in this case, the silicide film is not formed in the region covered with the silicide block film SB (that is, the region in which the opening OP is formed).

Subsequently, the interlayer insulating film ILD1 is formed over the substrate SUB. Subsequently, a connection hole is formed in the interlayer insulating film ILD1. Subsequently, the contacts BCTC, SCTC, DCTC are formed in the connection hole. In this way, the semiconductor device SD is produced.

Next, the action and effect of the embodiment will be explained. In the embodiment, the opening OP is formed in the field oxide film DFOX. Consequently, the ON-resistance between the source region SOR and the drain region DRR can be made low. Furthermore, in the embodiment, the edge of the opening OP on the source region SOR side closer to the drain region DRR than the side face of the gate electrode GE on the drain region DRR side in plan view. Consequently, the breakdown voltage between the gate electrode GE and the drain region DRR can be made high.

Specifically, when the opening OP is formed in the field oxide film DFOX, resultingly, the path of carriers increases in the second-conductivity type drift region NDR by the region in which the opening OP is formed. Consequently, the ON-resistance becomes small.

Figure 14A:
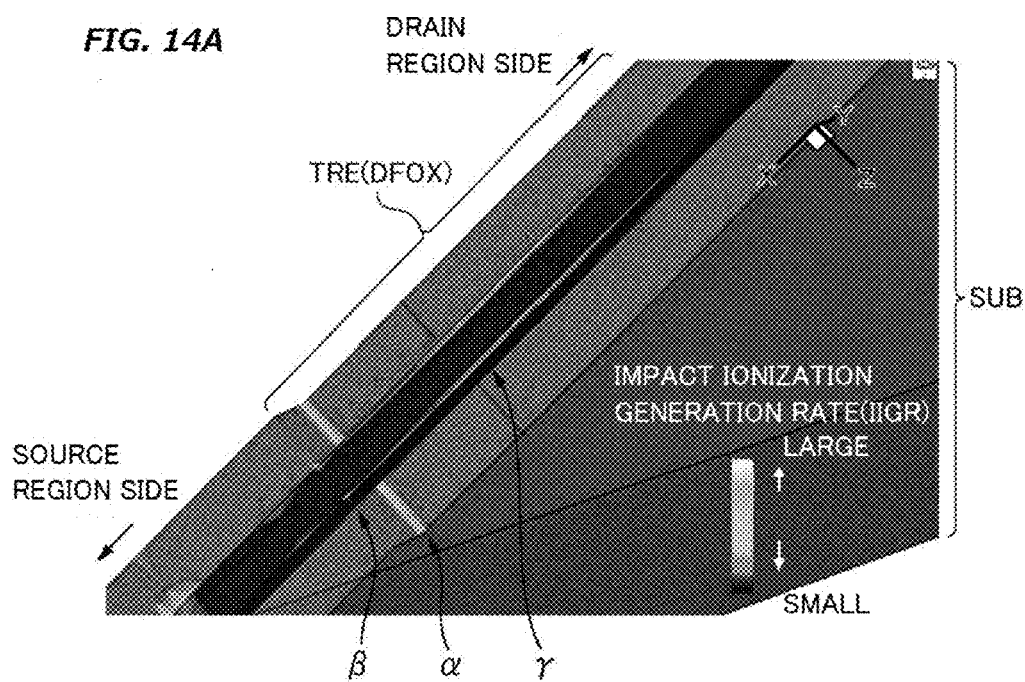
FIG. 14A is a drawing showing a result of simulating the distribution of impact ionization occurring in the periphery of an opening in a semiconductor device according to Comparative Example.
Figure 14B:
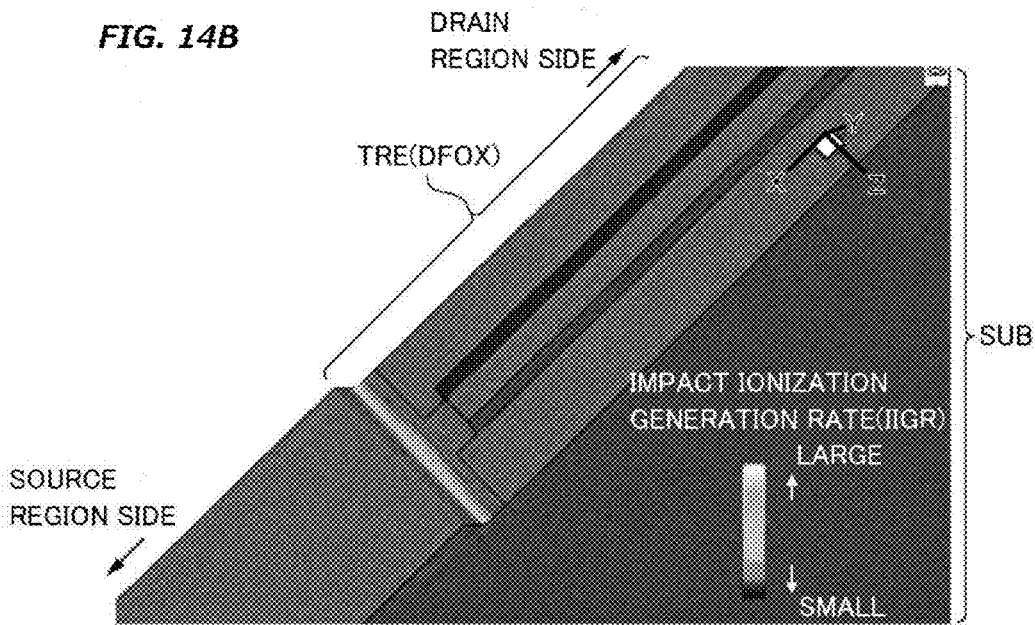
FIG. 14B is a drawing showing a result of simulating the distribution of impact ionization occurring in the periphery of an opening in a semiconductor device according to an embodiment.

On the other hand, the above-described high breakdown voltage will be explained using FIGS. 14A and 14B. FIG. 14A is a drawing showing a result of simulating the distribution of impact ionization occurring in the periphery of the opening OP in a semiconductor device SD according to Comparative Example. FIG. 14B is a drawing showing a result of simulating the distribution of impact ionization occurring in the periphery of the opening OP in the semiconductor device SD according to the embodiment. The semiconductor device SD according to Comparative Example has the same configuration as that of the semiconductor device SD according to the embodiment, except that the edge on the source region SOR side and the edge on the drain region DRR side of the opening OP pass through the field oxide film DFOX in the first direction (in the drawing, the x-axis direction). Meanwhile, for explanation, the drawing shows the state where the field oxide film DFOX has been removed from the substrate SUB (the second-conductivity type drift region NDR). In other words, the drawing shows the state where a trench (trench TRE) for STI is formed in the surface of the substrate SUB.

In Comparative Example (FIG. 14A), impact ionization occurs in an edge of the bottom face of the trench TRE on the source region SOR side (in the drawing, an α part), in a part located closer to the source region SOR than the α part in plan view and contacting the field oxide film DFOX on the front face side of the substrate SUB in the region between trenches TRE adjacent to each other (in the drawing, a β part), and in a part located closer to the drain region DRR than the α part in plan view and contacting the field oxide film DFOX on the front face side of the substrate SUB in the region between the trenches TRE adjacent to each other (in the drawing, a γ part). In contrast, in the embodiment (FIG. 14B), the impact ionization occurs only in the α part (the edge of the bottom face of the trench TRE on the source region SOR side). As described above, in the embodiment, the prevention of the impact ionization can have been achieved in regions (for example, the β part and the γ part) in which the impact ionization can not be prevented in Comparative Example. Therefore, it is possible to say that the embodiment can make the breakdown voltage high.

MODIFIED EXAMPLE 1

Figure 15:
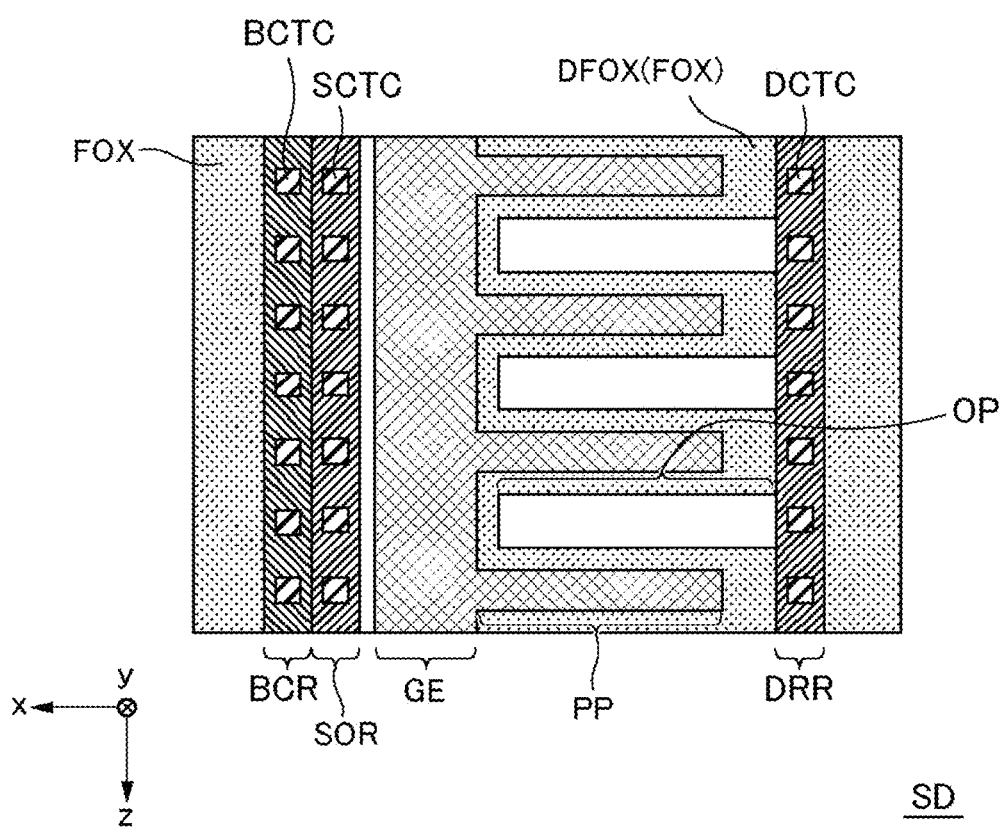
FIG. 15 is a plan view showing a semiconductor device according to Modified Example 1.

FIG. 15 is a plan view showing a semiconductor device SD according to Modified Example 1, and corresponds to FIG. 1 of the embodiment. The semiconductor device SD according to Modified Example 1 has the same configuration as that of the semiconductor device SD according to Modified Example 1, except that the edge of the opening OP on the drain region DRR side is connected to the drain region DRR. In other words, in the Modified Example, the edge of the opening OP on the drain region DRR side passes through the field oxide film DFOX and reaches the drain region DRR. In the Modified Example, too, in the gate electrode GE, the entire edge on the drain region DRR side rides on the field oxide film DFOX. Consequently, it is considered that the same effect as that in the embodiment can be obtained also in the Modified Example.

MODIFIED EXAMPLE 2

Figure 16:
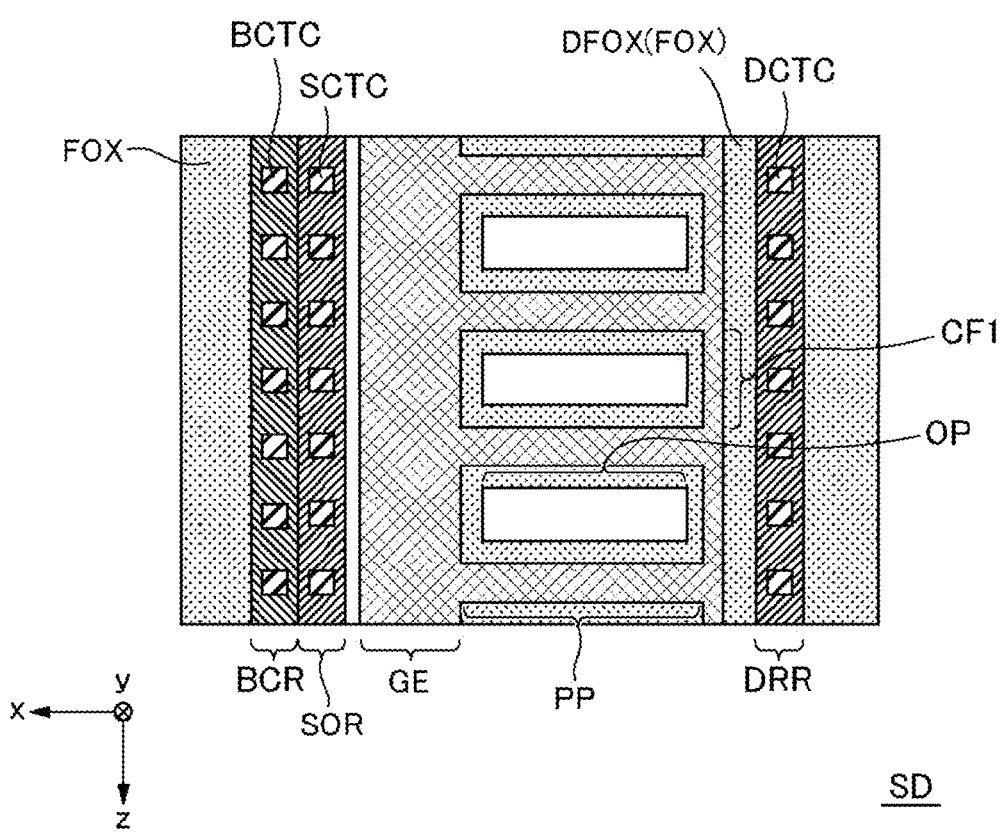
FIG. 16 is a plan view showing a semiconductor device according to Modified Example 2.

FIG. 16 is a plan view showing a semiconductor device SD according to Modified Example 2, and corresponds to FIG. 1 of the embodiment. The semiconductor device SD according to Modified Example 2 has the same configuration as that of the semiconductor device SD according to the embodiment except for the following point.

In Modified Example 2, as in the embodiment, the edge of the opening OP on the drain region DRR side lies closer to the source region SOR than the drain region DRR. In other words, on the drain region DRR side of the opening OP, a part of the field oxide film DFOX extends in the second direction (in the drawing, the z-axis direction) along the drain region DRR. Further, a conductive film CF1 is formed above the region into which relevant part of the field oxide film DFOX extends. The conductive film CF1 lies closer to the drain region DRR than the opening OP in plan view, and connects projection parts PP adjacent to each other. Specifically, the conductive film CF1 is formed integrally with the gate electrode GE and the projection part PP. In other words, the conductive film CF1 has been formed simultaneously with the gate electrode GE and the projection part PP by patterning.

According to Modified Example 2, the conductive film CF1 functions as a field plate. Specifically, a voltage same as that applied to the gate electrode GE is applied to the conductive film CF1. In this case, the concentration of an electric field at the edge part of the gate electrode GE on the drain region DRR side can be suppressed. Consequently, a high breakdown voltage can be realized.

MODIFIED EXAMPLE 3

Figure 17:
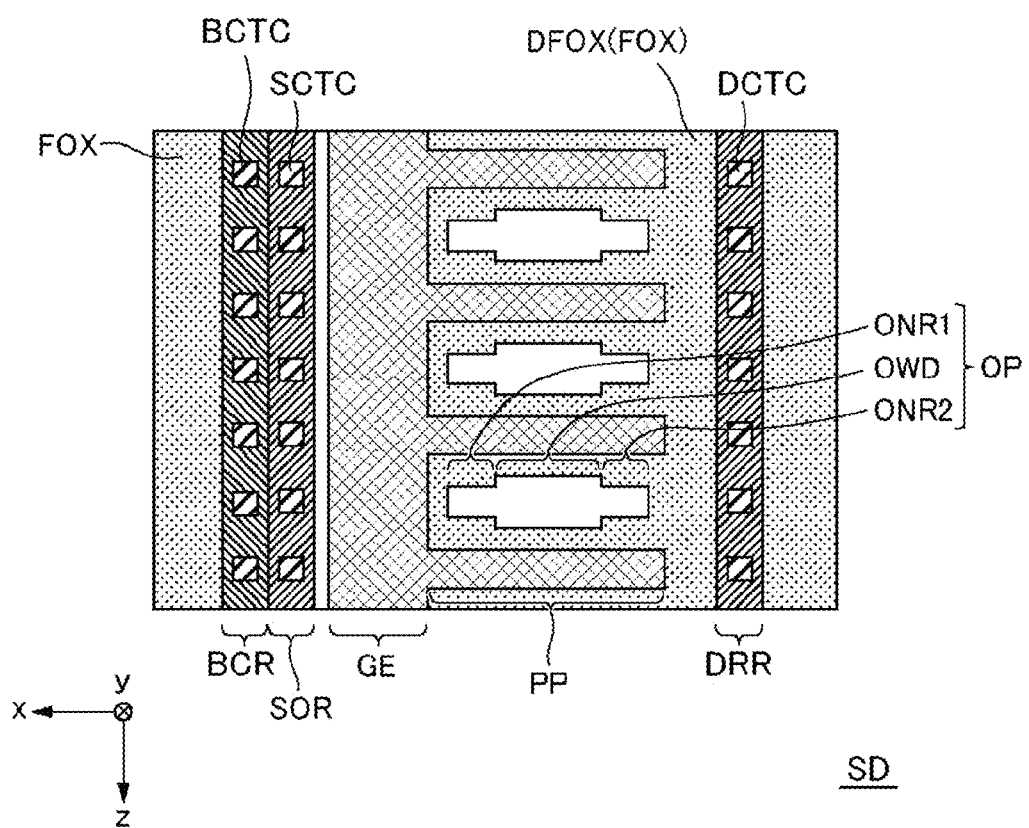
FIG. 17 is a plan view showing a semiconductor device according to Modified Example 3.

FIG. 17 is a plan view showing a semiconductor device SD according to Modified Example 3, and corresponds to FIG. 1 in the embodiment. The semiconductor device SD according to Modified Example 3 has the same configuration as that of the semiconductor device SD according to the embodiment except for the following point.

In Modified Example 3, the width of the planar shape of the opening OP in the second direction (in the drawing, the z-axis direction) differs depending on regions. Specifically, the opening OP includes a narrow part ONR1 (an opening source side part), a wide part OWD (an opening first adjacent part and an opening second adjacent part) and a narrow part ONR2 (an opening drain side part). The narrow part ONR1, the wide part OWD and the narrow part ONR2 are arranged side by side in this order from the source region SOR side toward the drain region DRR side, and are adjacent to each other. Further, the narrow parts ONR1, ONR2 each have a narrower width than the wide part OWD in the second direction. Meanwhile, the planar shape of the opening OP can be realized by the control of the planar shape of the trench of STI upon forming the field oxide film DFOX.

When the width of the opening OP is narrow, it is considered that the breakdown voltage between the gate electrode GE and the drain region DRR can be made high, but that the ON-resistance between the gate electrode GE and the drain region DRR becomes high. In contrast, when the width of the opening OP is wide, it is considered that the ON-resistance can be made low, but that the breakdown voltage becomes low. As described above, a high breakdown voltage and a low ON-resistance are in a trade-off relationship regarding the wideness of the width of the opening OP. In contrast, in Modified Example 3, the width of the opening OP is partially made narrow. It is considered that, consequently, both a high breakdown voltage and a low ON-resistance can be realized at the same time.

Meanwhile, in the example shown in the drawing, the width of the wide part OWD in the second direction (in the drawing, the z-axis direction) is constant, but the planar shape of the wide part OWD is not limited to the example shown in the drawing. The wide part OWD can have a planar shape different from the example shown in the drawing, when the part adjacent to the narrow part ONR1 (the opening first adjacent part) is wider than the narrow part ONR1, and the part adjacent to the narrow part ONR2 (the opening second adjacent part) is wider than the narrow part ONR2. For example, the wide part OWD may have a width wider than the opening first adjacent part and the opening second adjacent part between the opening first adjacent part and the opening second adjacent part, or may have a width narrower than the narrow part ONR1 and the narrow part ONR2 between the opening first adjacent part and the opening second adjacent part.

MODIFIED EXAMPLE 4

Figure 18:
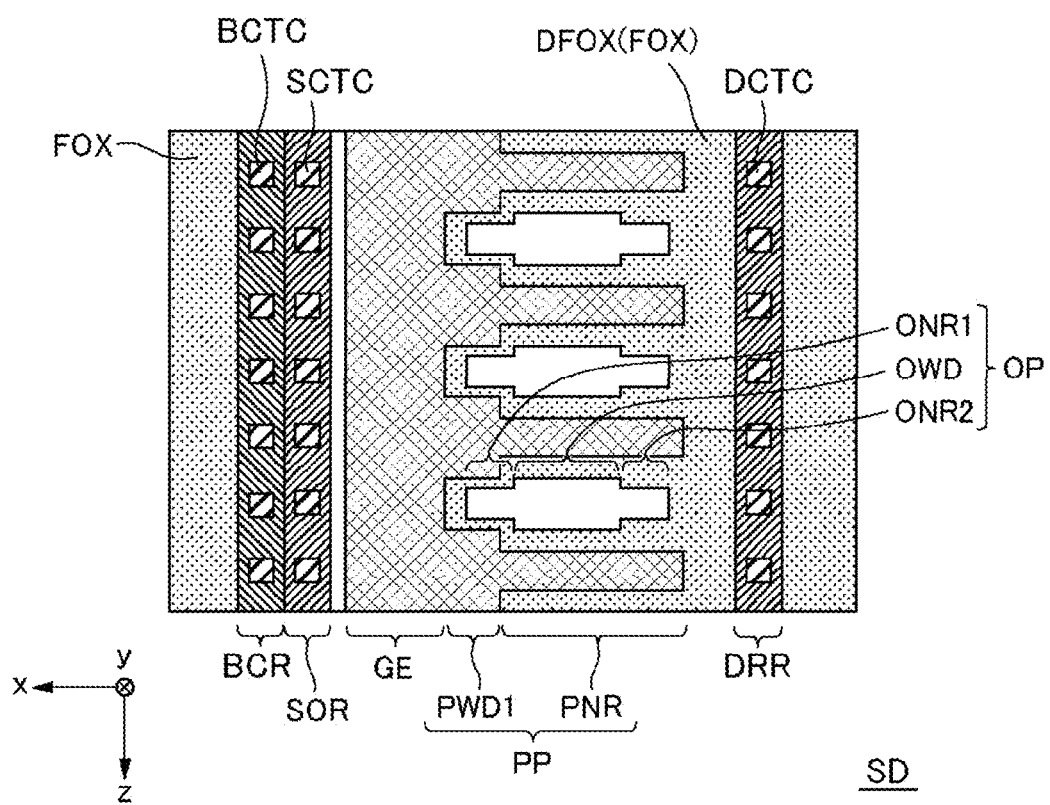
FIG. 18 is a plan view showing a semiconductor device according to Modified Example 4.

FIG. 18 is a plan view showing a semiconductor device SD according to Modified Example 4, and corresponds to FIG. 17 in Modified Example 3. The semiconductor device SD according to Modified Example 4 has the same configuration as that of the semiconductor device SD according to Modified Example 3 except for the following point.

In Modified Example 4, the width of the projection part PP in the second direction (in the drawing, the z-axis direction) is different depending on regions. Specifically, the projection part PP includes a wide part PWD1 (a projection source side part) and a narrow part PNR (a projection first adjacent part). The wide part PWD1 and the narrow part PNR are arranged side by side in this order from the source region SOR side toward the drain region DRR side, and are adjacent to each other. The wide part PWD1 lies closer to the source region SOR than the wide part OWD of the opening OP. Further, the wide part PWD1 has a wider width in the second direction than the narrow part PNR. In more detail, in the projection part PP, a side face extending from the wide part PWD1 to the narrow part PNR has a shape along the shape of the side face extending from the narrow part ONR1 to the wide part OWD of the opening OP in plan view.

According to Modified Example 4, the width of the base of the projection part PP (the wide part PWD1) becomes wider partially. Consequently, the concentration of an electric field in the base of the projection part PP can be relaxed more.

Meanwhile, in the example shown in the drawing, the width of the narrow part PNR in the second direction (in the drawing, the z-axis direction) is constant, but the planar shape of the narrow part PNR is not limited to the example shown in the drawing. The narrow part PNR can have a planar shape different from the example shown in the drawing, when the part adjacent to the wide part PWD1 (the projection first adjacent part) is narrower than the wide part PWD1. For example, the narrow part PNR may have a narrower width than the projection first adjacent part on a side closer to the drain region DRR than the projection first adjacent part, or may have a wider width than the wide part PWD1 on a side closer to the drain region DRR than the projection first adjacent part.

MODIFIED EXAMPLE 5

Figure 19:
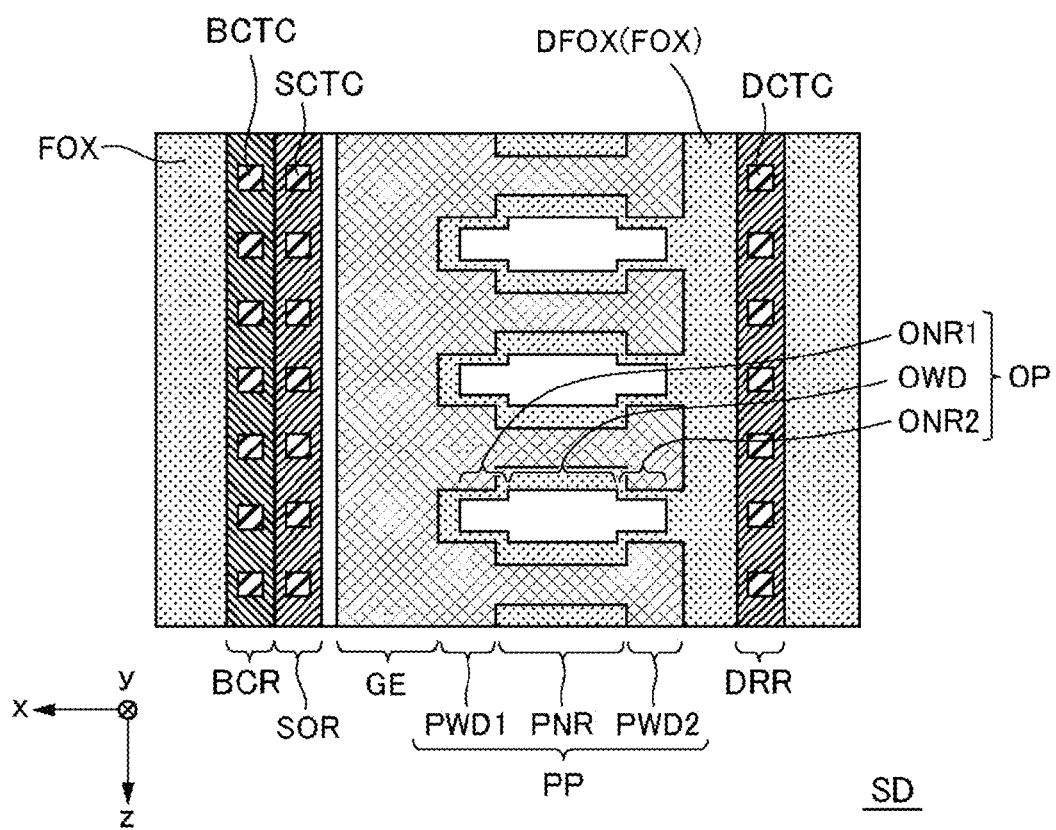
FIG. 19 is a plan view showing a semiconductor device according to Modified Example 5.

FIG. 19 is a plan view showing a semiconductor device SD according to Modified Example 5, and corresponds to FIG. 18 in Modified Example 4. The semiconductor device SD according to Modified Example 5 has the same configuration as that of the semiconductor device SD according to Modified Example 4 except for the following point.

In Modified Example 5, too, the width of the projection part PP in the second direction (in the drawing, the z-axis direction) differs depending on regions. Specifically, the projection part PP includes the wide part PWD1 (the projection source side part), the narrow part PNR (the projection first adjacent part and the projection second adjacent part) and the wide part PWD2 (the projection drain side part). The wide part PWD1, the narrow part PNR and the wide part PWD2 are arranged side by side in this order from the source region SOR side toward the drain region DRR side, and are adjacent to each other. The wide part PWD1 lies closer to the source region SOR than the wide part OWD of the opening OP. On the other hand, the wide part PWD2 lies closer to the drain region DRR than the wide part OWD of the opening OP. Further, the wide part PWD1 has a wider width than the narrow part PNR in the second direction. On the other hand, the wide part PWD2 also has a wider width than the narrow part PNR in the second direction. In detail, in the projection part PP, the side face extending from the wide part PWD1 to the wide part PWD2 via the narrow part PNR has a shape along the shape of the side face extending from the narrow part ONR1 to the narrow part ONR2 of the opening OP via the wide part OWD in plan view.

According to Modified Example 5, the width of the tip end of the projection part PP (the wide part PWD2) becomes wider partially. Consequently, the concentration of an electric field at the tip end of the projection part PP can be relaxed more.

Meanwhile, in the example shown in the drawing, the width of the narrow part PNR in the second direction (in the drawing, the z-axis direction) is constant, but the planar shape of the narrow part PNR is not limited to the example shown in the drawing. The narrow part PNR can have a planar shape different from the example shown in the drawing, when the part adjacent to the wide part PWD1 (the projection first adjacent part) is narrower than the wide part PWD1 and the part adjacent to the wide part PWD2 (the projection second adjacent part) is narrower than the wide part PWD2. For example, the narrow part PNR may have a narrower width than the projection first adjacent part and the projection second adjacent part between the projection first adjacent part and the projection second adjacent part, or may have a wider width than the wide part PWD1 and the wide part PWD2 between the projection first adjacent part and the projection second adjacent part.

MODIFIED EXAMPLE 6

Figure 20:
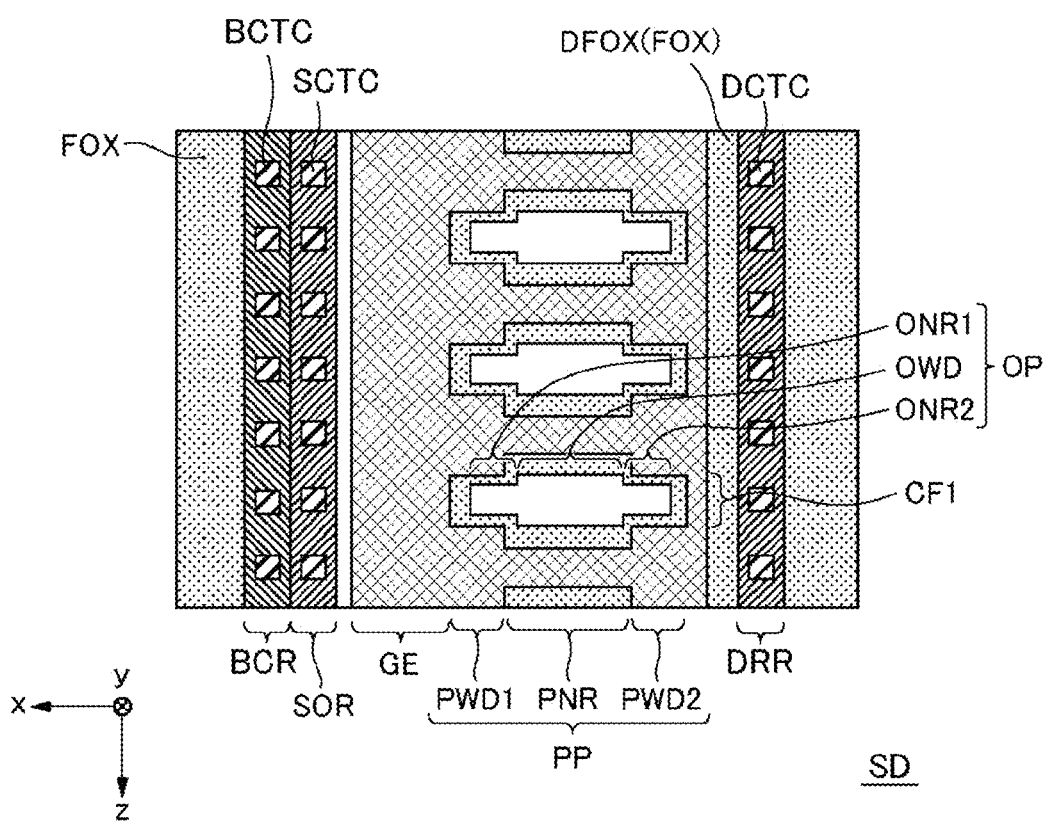
FIG. 20 is a plan view showing a semiconductor device according to Modified Example 6.

FIG. 20 is a plan view showing a semiconductor device SD according to Modified Example 6, and corresponds to FIG. 19 in Modified Example 5. The semiconductor device SD according to Modified Example 6 has the same configuration as that of the semiconductor device SD according to Modified Example 5 except for the following point.

In Modified Example 6, as in Modified Example 2 (FIG. 16), the edge of the opening OP on the drain region DRR side lies closer to the source region SOR than the drain region DRR. In other words, on the drain region DRR side of the opening OP, a part of the field oxide film DFOX extends in the second direction (in the drawing, the z-axis direction) along the drain region DRR. Further, a conductive film CF1 is formed above the region into which relevant part of the field oxide film DFOX extends. The conductive film CF1 lies closer to the drain region DRR than the opening OP in plan view, and connects projection parts PP adjacent to each other. Specifically, the conductive film CF1 is formed integrally with the gate electrode GE and the projection part PP. In other words, the conductive film CF1 has been formed simultaneously with the gate electrode GE and the projection part PP by patterning. The conductive film CF1 functions as a field plate as in Modified Example 2. Consequently, a high breakdown voltage can be realized.

MODIFIED EXAMPLE 7

Figure 21:
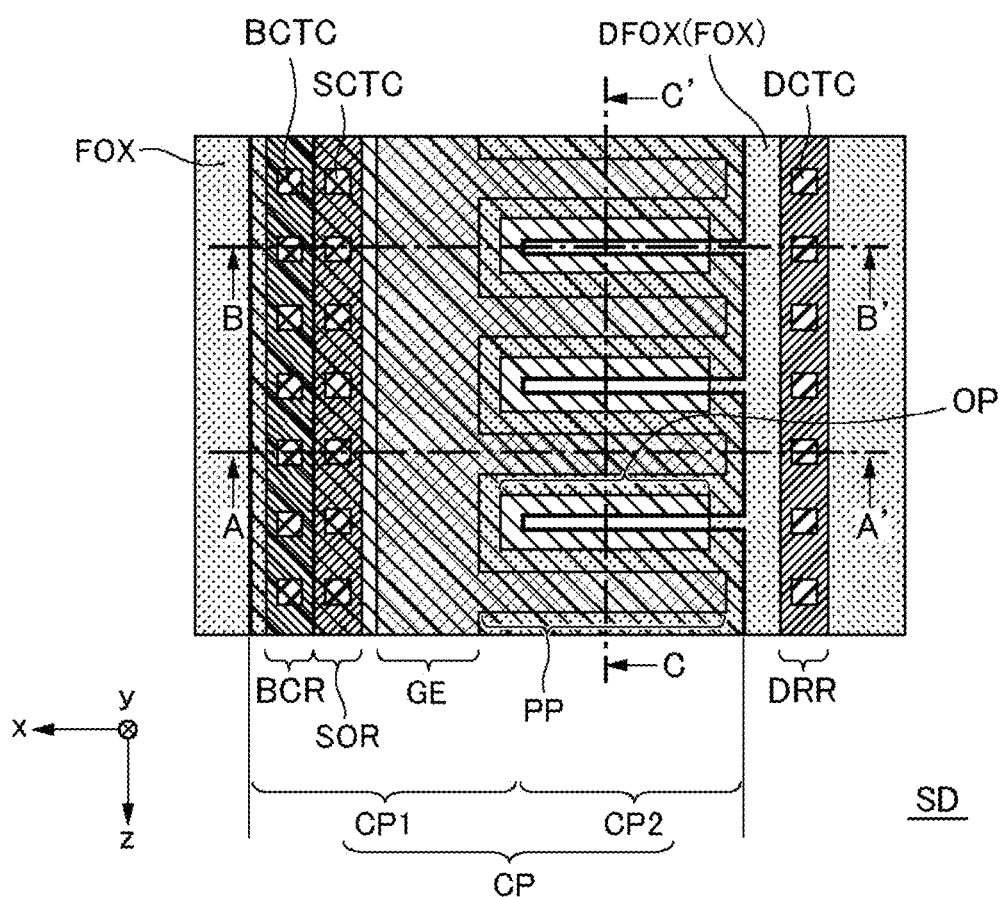
FIG. 21 is a plan view showing a semiconductor device according to Modified Example 7.
Figure 22:
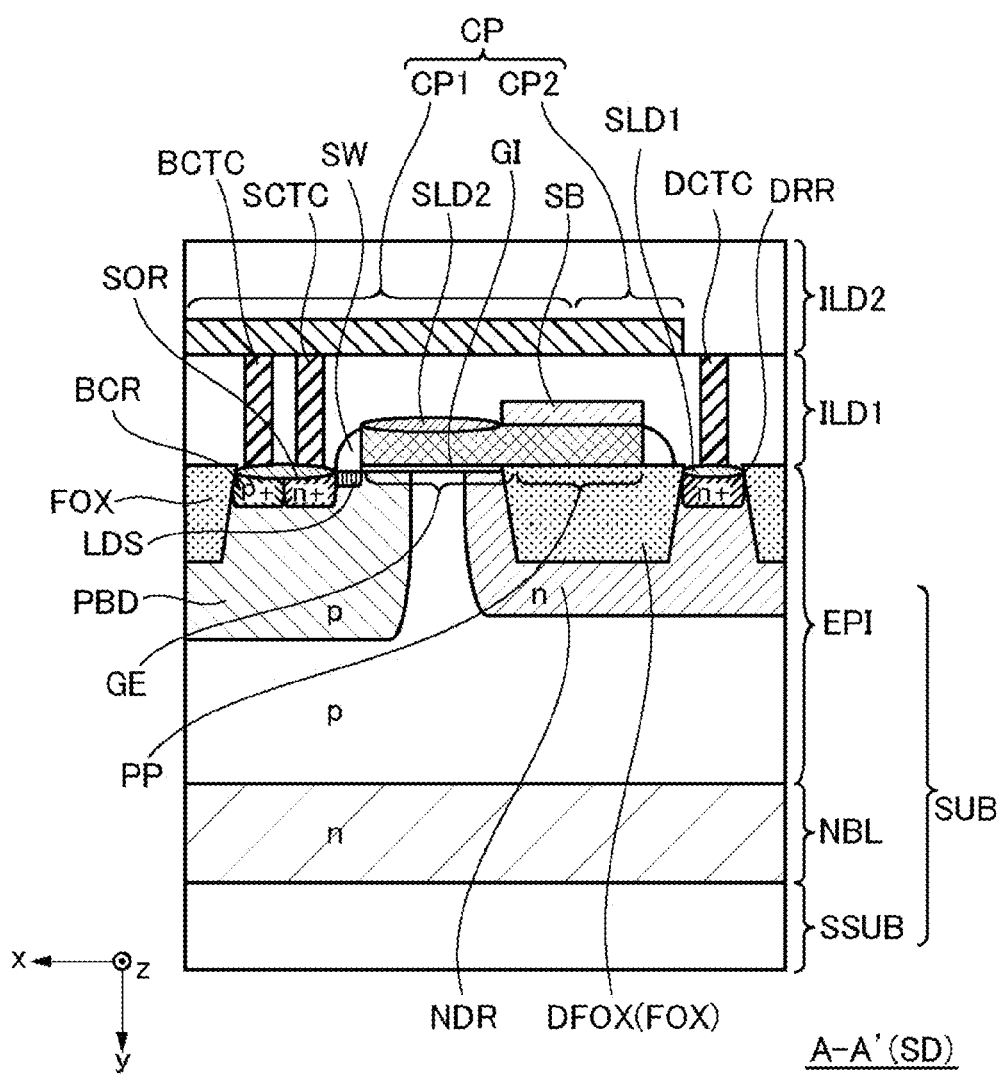
FIG. 22 is an A-A' cross-sectional view in FIG. 21.
Figure 23:
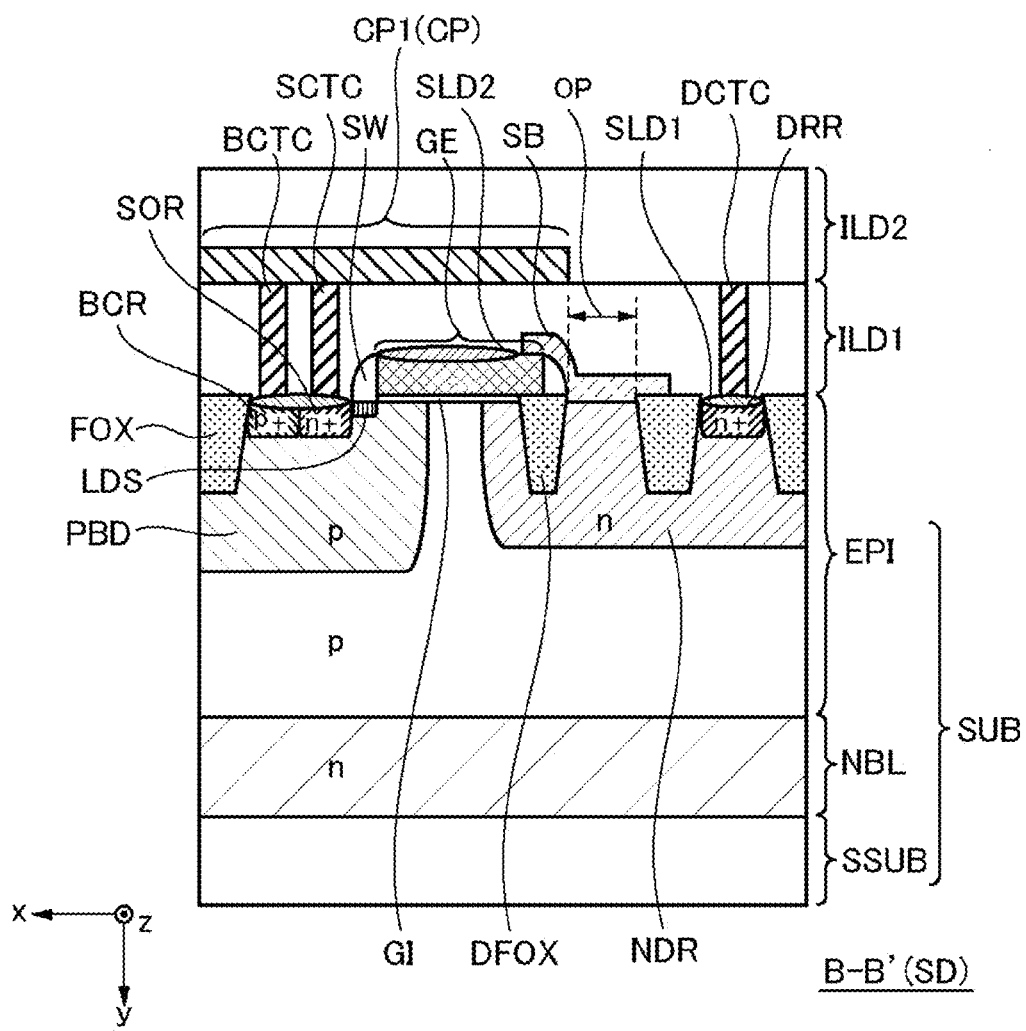
FIG. 23 is a B-B' cross-sectional view in FIG. 21.
Figure 24:
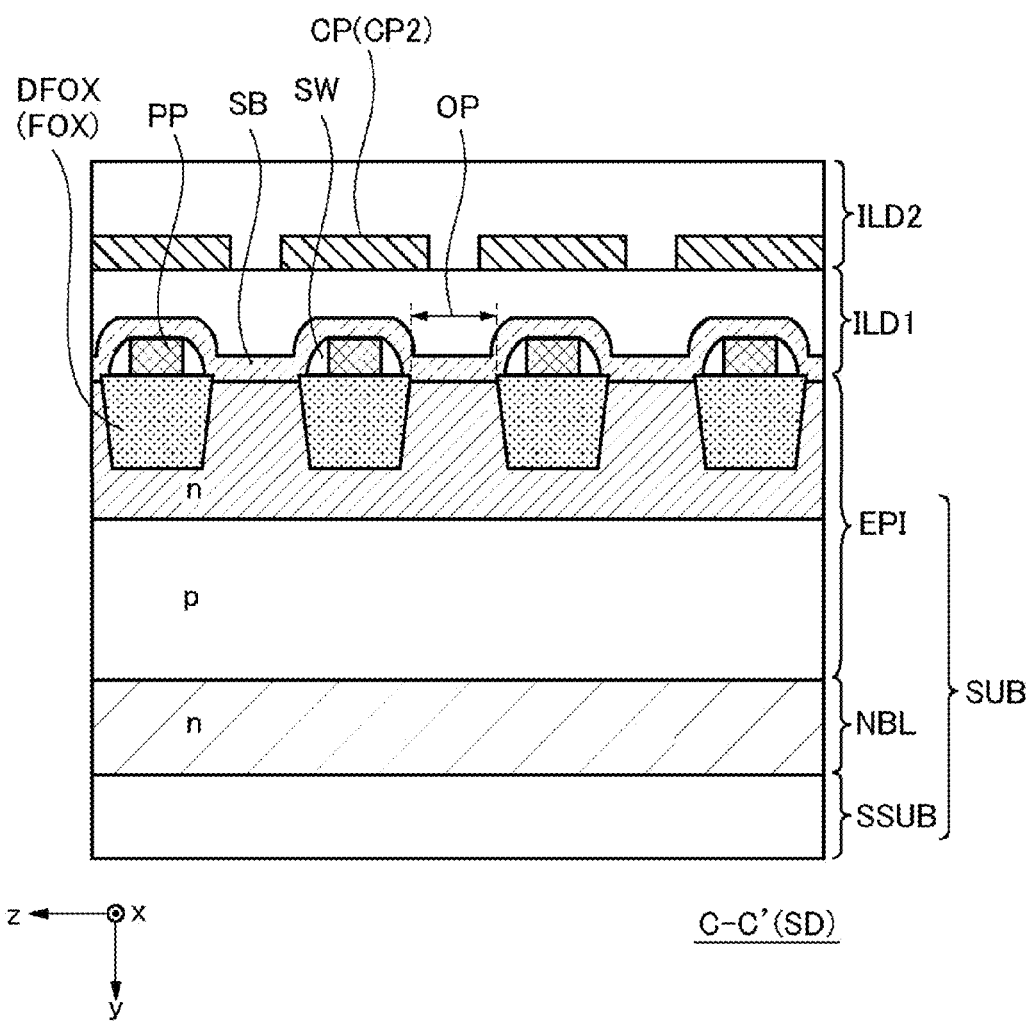
FIG. 24 is a C-C' cross-sectional view in FIG. 21.

FIG. 21 is a plan view showing a semiconductor device SD according to Modified Example 7, and corresponds to FIG. 1 in the embodiment. FIG. 22 is an A-A' cross-sectional view in FIG. 21, and corresponds to FIG. 2 in the embodiment. FIG. 23 is a B-B' cross-sectional view in FIG. 21, and corresponds to FIG. 3 in the embodiment. FIG. 24 is a C-C' cross-sectional view in FIG. 21, and corresponds to FIG. 4 in the embodiment. The semiconductor device SD according to Modified Example 7 has the same configuration as that of the semiconductor device SD according to the embodiment except for the following point.

In Modified Example 7, a conductor pattern CP lies above the gate electrode GE and the projection part PP via the interlayer insulating film ILD1. The conductor pattern CP is covered with an interlayer insulating film (the interlayer insulating film ILD2) lying directly on the interlayer insulating film ILD1, and lies over the surface of the interlayer insulating film ILD1. The conductor pattern CP is formed, for example, from a material (for example, aluminum) same as wiring (in the drawing, not shown) formed on the interlayer insulating film ILD2. Further, the conductor pattern CP is connected electrically with the source region SOR via the contact SCTC. Consequently, a voltage same as that applied to the source region SOR (for example, the ground potential) is applied to the conductor pattern CP. Further, the conductor pattern CP includes an extending part CP1 (a conductor extending part) and a plurality of projection parts CP2 (a conductor projection part). Meanwhile, in the drawing, for explanation, wiring connected to the contact DCTC (a contact connected to the drain region DRR) is not shown. Actually, on the interlayer insulating film ILD2, wiring connected with the contact DCTC is formed.

The extending part CP1 lies above the gate electrode GE. Further, the extending part CP1 extends in the second direction (in the drawing, the z-axis direction) in plan view. The projection parts CP2 project from the side face of the extending part CP1 from the source region SOR side toward the drain region DRR side in plan view. In the example shown in the drawing, the tip end of the projection part CP2 is located closer to the source region SOR than the drain region DRR in plan view. Further, the projection parts CP2 are provided, corresponding to each of the projection parts PP of the gate electrode GE. Further, the projection parts CP2 are arranged side by side along the second direction in plan view. Further, the extending part CP1 and the projection parts CP2 include therein the drain region DRR side of the gate electrode GE and the projection parts PP in plan view. In other words, the extending part CP1 and the projection parts CP2 on the drain region DRR side have the planar shapes along the planar shapes of the gate electrode GE on the drain region DRR side and the projection parts PP.

Meanwhile, in the example shown in the drawing, the conductor pattern CP is formed in the interlayer insulating film (the interlayer insulating film ILD2) lying directly on the interlayer insulating film of the lowermost layer of a wiring layer (the interlayer insulating film ILD1). However, an interlayer insulating film on which the conductor pattern CP is formed is not limited to the example shown in the drawing (the interlayer insulating film ILD2). For example, the conductor pattern CP may be formed on an interlayer insulating film on a side upper than the interlayer insulating film ILD2. In this case, an interlayer insulating film lying on the lower side of the conductor pattern CP preferably does not have wiring in a region overlapping the conductor pattern CP in plan view.

According to Modified Example 7, the projection part CP2 of the conductor pattern CP also functions as a field plate. Consequently, the concentration of an electric field at the edge of the gate electrode GE on the drain region DRR side can be suppressed. Therefore, the breakdown voltage between the gate electrode GE and the drain region DRR becomes high.

MODIFIED EXAMPLE 8

Figure 25:
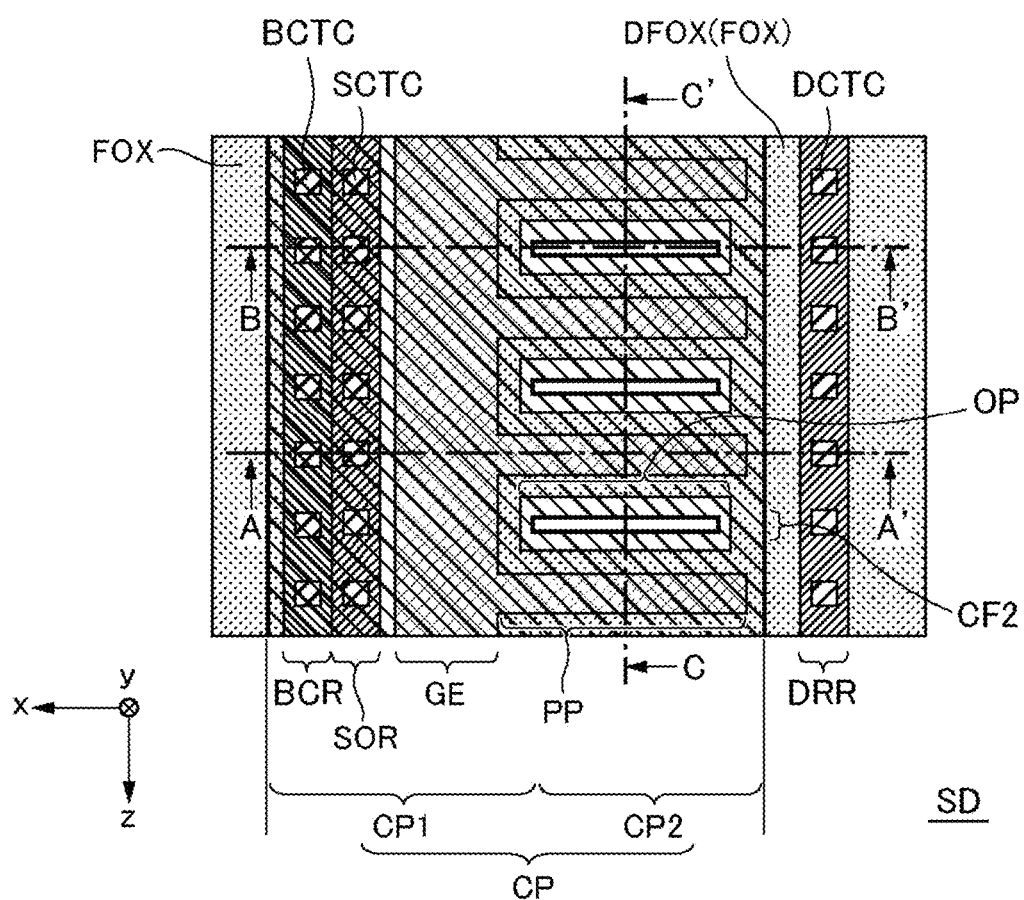
FIG. 25 is a plan view showing a semiconductor device according to Modified Example 8.

FIG. 25 is a plan view showing a semiconductor device SD according to Modified Example 8, and corresponds to FIG. 21 in Modified Example 7. The semiconductor device SD according to Modified Example 8 has the same configuration as that of the semiconductor device SD according to Modified Example 7 except for the following point.

In Modified Example 8, parts of mutually adjacent projection parts CP2 on the drain region DRR side are connected with each other by the conductive film CF2. In the example shown in the drawing, the conductive film CF2 lies closer to the source region SOR than the drain region DRR in plan view. Specifically, the conductive film CF2 is formed integrally with the conductor pattern CP (the extending part CP1 and the projection parts CP2). In other words, the conductive film CF2 is formed simultaneously with the conductor pattern CP by patterning.

According to Modified Example 8, the conductive film CF2 functions as a field plate. Specifically, a voltage same as that applied to the conductor pattern CP (the potential of source region SOR) is applied to the conductive film CF2. In this case, the concentration of an electric field at the edge part of the gate electrode GE on the drain region DRR side can be suppressed. Consequently, a high breakdown voltage can be realized.

MODIFIED EXAMPLE 9

Figure 26:
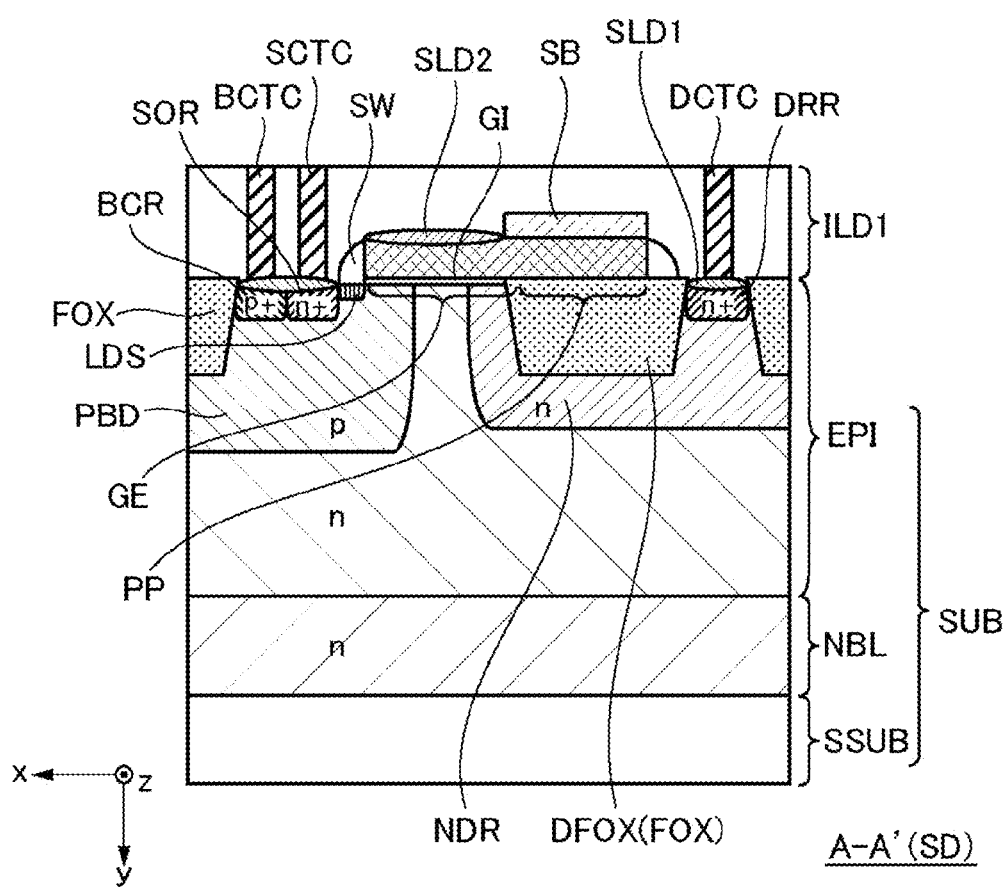
FIG. 26 is a plan view showing a semiconductor device according to Modified Example 9.

FIG. 26 is a cross-sectional view showing a semiconductor device SD according to Modified Example 9, and corresponds to FIG. 2 in the embodiment. The semiconductor device SD according to Modified Example 9 has the same configuration as that of the semiconductor device SD according to the embodiment except for the point that the conductivity type of the epitaxial layer EPI of the substrate SUB is the second-conductivity type (then-type). An effect same as that in the embodiment can be obtained also in Modified Example 9.

MODIFIED EXAMPLE 10

Figure 27:
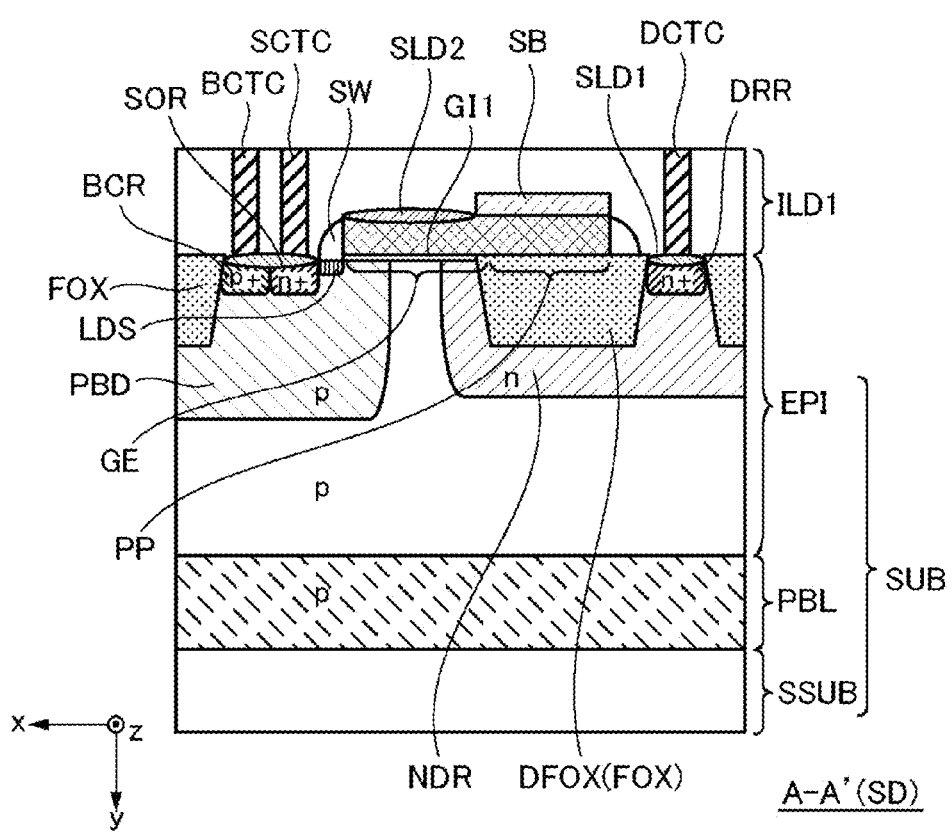
FIG. 27 is a plan view showing a semiconductor device according to Modified Example 10.

FIG. 27 is a cross-sectional view showing a semiconductor device SD according to Modified Example 10, and corresponds to FIG. 2 in the embodiment. The semiconductor device SD according to Modified Example 10 has the same configuration as that of the semiconductor device SD according to the embodiment, except for the point that a first-conductivity type buried region PBL is formed in place of the second-conductivity type buried region NBL according to the embodiment. In other words, in Modified Example 10, the conductivity type of the buried region of the substrate SUB is opposite to that in the embodiment. In Modified Example 10, too, an effect same as that in the embodiment can be obtained.

MODIFIED EXAMPLE 11

Figure 28:
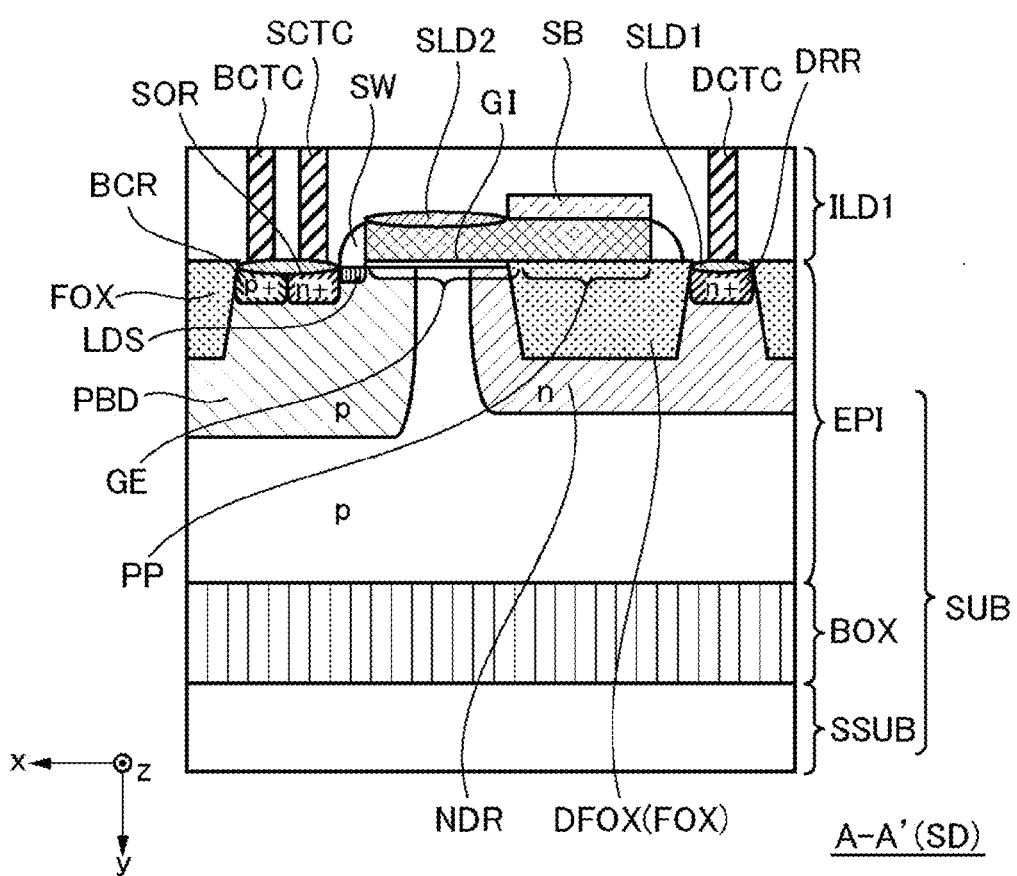
FIG. 28 is a plan view showing a semiconductor device according to Modified Example 11.

FIG. 28 is a cross-sectional view showing a semiconductor device SD according to Modified Example 11, and corresponds to FIG. 2 in the embodiment. The semiconductor device SD according to Modified Example 11 has the same configuration as that of the semiconductor device SD according to the embodiment, except for the point that the substrate SUB is an SOI (Silicon on Insulator) substrate. Specifically, in the substrate SUB according to Modified Example 11, the semiconductor substrate SSUB, a buried oxide film BOX and the epitaxial layer EPI are stacked in this order. In Modified Example 11, too, an effect same as that in the embodiment can be obtained.

MODIFIED EXAMPLE 12

Figure 29:
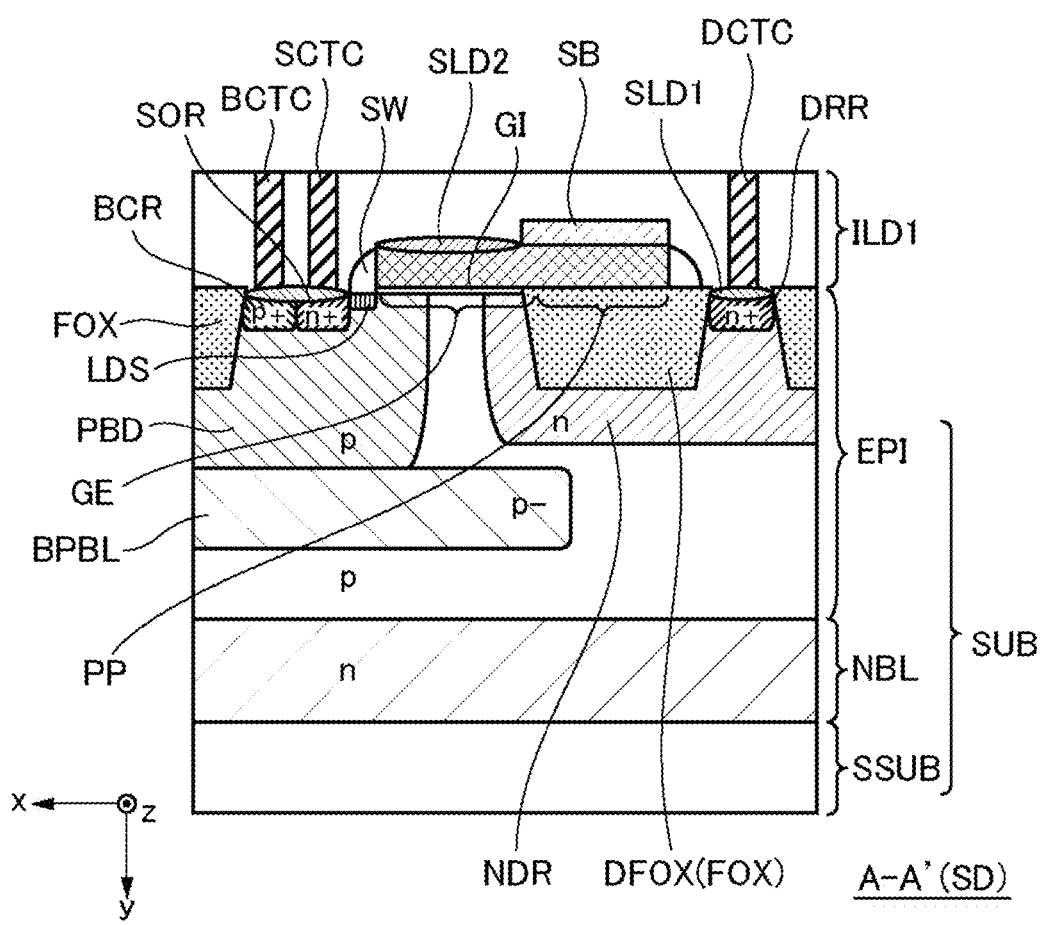
FIG. 29 is a plan view showing a semiconductor device according to Modified Example 12.

FIG. 29 is a cross-sectional view showing a semiconductor device SD according to Modified Example 12, and corresponds to FIG. 2 in the embodiment. The semiconductor device SD according to Modified Example 12 has the same configuration as that of the semiconductor device SD according to the embodiment, except for the point that a first-conductivity type buried region BPBL is formed below the first-conductivity type body region PBD.

In detail, the first-conductivity type buried region BPBL is connected to the bottom face of the first-conductivity type body region PBD. Consequently, the voltage of the first-conductivity type body region PBD is applied to the first-conductivity type buried region BPBL. Further, the first-conductivity type buried region BPBL extends from the first-conductivity type buried region BPBL toward the drain region DRR side. Further, the edge part of the first-conductivity type buried region BPBL on the drain region DRR side reaches the field oxide film DFOX region in plan view. Meanwhile, in the example shown in the drawing, the first-conductivity type buried region BPBL is not connected with the second-conductivity type drift region NDR.

According to Modified Example 12, a depletion layer is formed by the first-conductivity type buried region BPBL. Further, the first-conductivity type buried region BPBL reaches the second-conductivity type drift region NDR in plan view. Therefore, it is possible to allow the depletion layer formed by the first-conductivity type buried region BPBL also to reach the second-conductivity type drift region NDR side. Consequently, the breakdown voltage between the gate electrode GE and the drain region DRR can be made higher.

MODIFIED EXAMPLE 13

Figure 30:
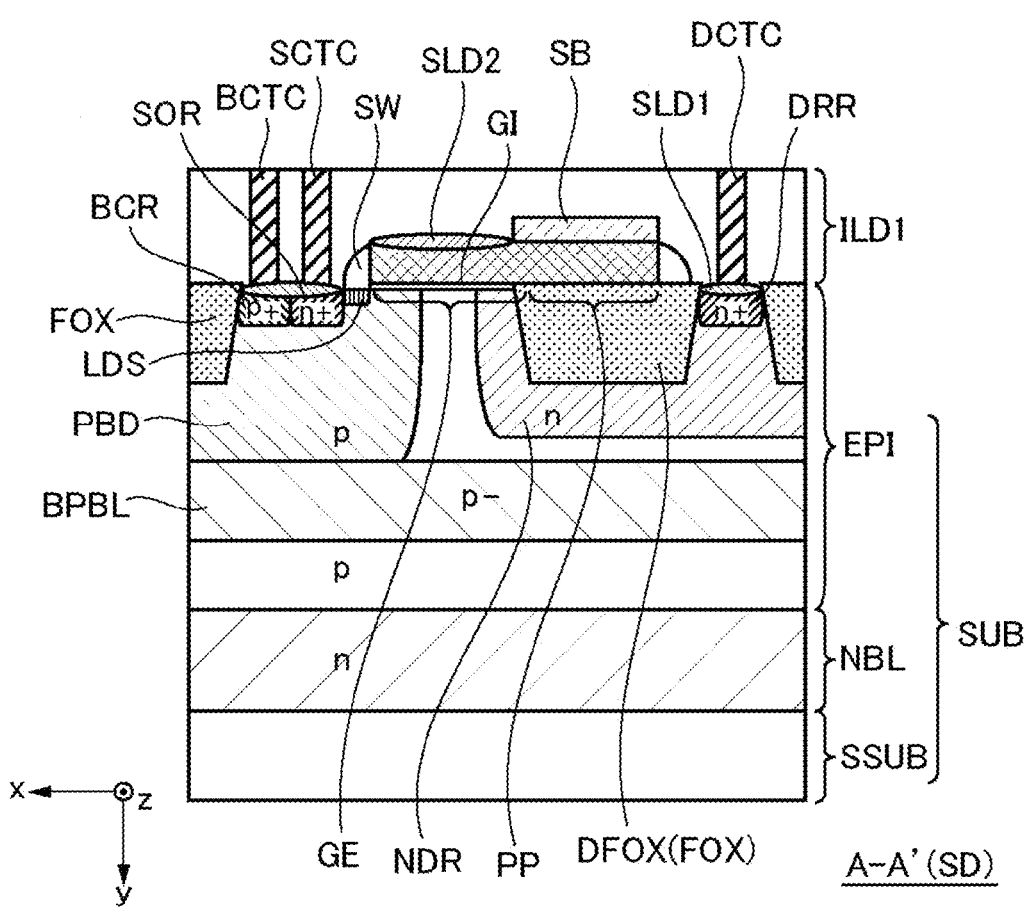
FIG. 30 is a plan view showing a semiconductor device according to Modified Example 13.

FIG. 30 is a cross-sectional view showing a semiconductor device SD according to Modified Example 13, and corresponds to FIG. 29 in Modified Example 12. The semiconductor device SD according to Modified Example 13 has the same configuration as that of the semiconductor device SD according to the embodiment, except for the point that the edge part of the first-conductivity type buried region BPBL on the drain region DRR side reaches the region overlapping the drain region DRR in plan view. In Modified Example 13, the first-conductivity type buried region BPBL is formed, for example, in the entire substrate SUB. According to Modified Example 13, the breakdown voltage can be made furthermore higher as compared with Modified Example 12.

MODIFIED EXAMPLE 14

Figure 31:
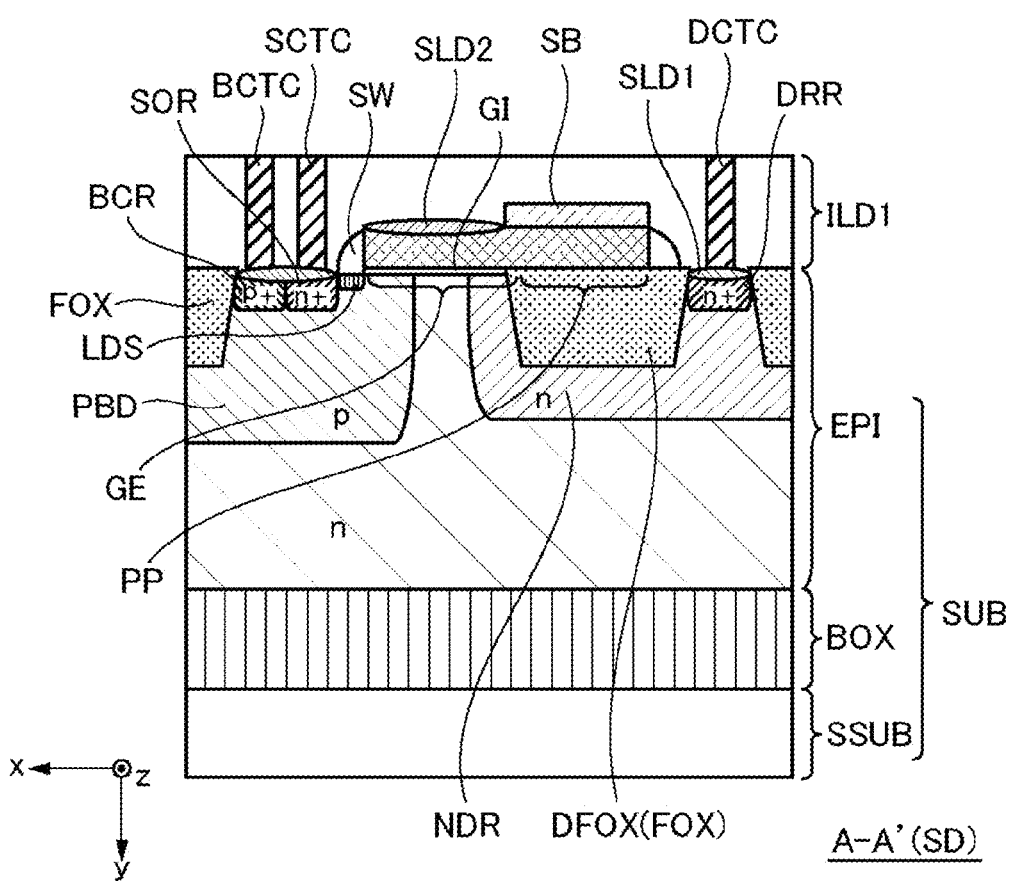
FIG. 31 is a plan view showing a semiconductor device according to Modified Example 14.

FIG. 31 is a cross-sectional view showing a semiconductor device SD according to Modified Example 14, and corresponds to FIG. 28 according to Modified Example 11. The semiconductor device SD according to Modified Example 14 has the same configuration as that of the semiconductor device SD according to Modified Example 11, except for the point that the conductivity type of the epitaxial layer EPI of the substrate SUB is the second-conductivity type (then-type). In Modified Example 14, too, an effect same as that in Modified Example 11 can be obtained.

Hereinbefore, the invention attained by the present inventor is explained specifically based on the embodiment, but, needless to say, the invention is not limited to the embodiment and can be changed variously in the range that does not deviate from the gist thereof.

What is claimed is:

1. A semiconductor device comprising:
   a substrate;
   a semiconductor layer formed in the substrate;
   a first-conductivity type region formed in the semiconductor layer;
   a second-conductivity type region formed in the semiconductor layer and arranged side by side with the first-conductivity type region in a first direction in plan view;
   a gate electrode disposed on the semiconductor layer, extending from the first-conductivity type region to the second-conductivity type region in plan view, and extending in a second direction orthogonal to the first direction in plan view;
   a gate insulating film covered by the gate electrode;
   a source region formed in the first-conductivity type region;
   a drain region formed in the second-conductivity type region and spaced apart from the gate electrode;
   a field insulating film formed in a surface layer of the second-conductivity type region, the field insulating film including a first pattern extending under the gate electrode in the second direction, and a plurality of second patterns respectively extending in the first direction from the first pattern toward the drain region, the plurality of second patterns being connected to each other through the first pattern; and
   a plurality of conductive projections projecting from a side face of the gate electrode in a direction from the source region side toward the drain region side and arranged side by side along the second direction in plan view,
   wherein the second-conductivity type region comprises a plurality of surface portions, each of which contacts the first pattern and two immediately adjacent second patterns of the plurality of second patterns of the field insulating film and each of which is located between two immediately adjacent conductive projections of the plurality of conductive projections in plan view, the plurality of surface portions being arranged side by side alternately with the plurality of conductive projections along the second direction, and
   the plurality of surface portions of the second-conductivity type region do not overlap the gate electrode in plan view.

2. The semiconductor device according to claim 1,
   wherein the field insulating film further comprises a connection pattern connecting ends of the plurality of second patterns of the field insulating film to each other such that the plurality of surface portions of the second-conductivity type region are separated from the drain region by the connection pattern of the field insulating film, and
   wherein the semiconductor device further comprises a conductive film formed on the connection pattern of the field insulating film and connecting the conductive projections immediately adjacent to each other.

3. The semiconductor device according to claim 1,
   wherein:
   the surface portion of the second-conductivity type region includes a source side part located on the source region side, a first adjacent part closer to the drain region than the source side part and adjacent to the source side part, a drain side part located on the drain region side, and a second adjacent part closer to the source region than the drain side part and adjacent to the drain side part;
   the source side part has a narrower width than the first adjacent part in the second direction; and
   the drain side part has a narrower width than the second adjacent part in the second direction.

4. The semiconductor device according to claim 3,
   wherein:
   the conductive projection includes a projection source side part located closer to the source region than the first adjacent part, and a projection first adjacent part closer to the drain region than the projection source side part and adjacent to the projection source side part; and the projection source side part has a wider width than the projection first adjacent part in the second direction.

5. The semiconductor device according to claim 4, wherein:

the conductive projection includes a projection drain side part located closer to the drain region than the second adjacent part, and a projection second adjacent part closer to the source region than the projection drain side part and adjacent to the projection drain side part; and the projection drain side part has a wider width than the projection second adjacent part in the second direction.

6. The semiconductor device according to claim 5, wherein the field insulating film further comprises a connection pattern connecting ends of the plurality of second patterns of the field insulating film to each other such that the plurality of surface portions of the second-conductivity type region are separated from the drain region by the connection pattern of the field insulating film, and wherein the semiconductor device further comprises a conductive film formed on the connection pattern of the field insulating film connecting the conductive projections immediately adjacent to each other.

7. The semiconductor device according to claim 1, further comprising:

an interlayer insulating film formed over the substrate;

a conductor pattern formed over the interlayer insulating film; and a contact that passes through the interlayer insulating film and connects the conductor pattern with the source region, wherein the conductor pattern includes a conductor extending part located above the gate electrode and extending in the second direction in plan view, and a plurality of conductor projection parts which projects from a side face of the conductor extending part from the source region side toward the drain region side in plan view, each of which is provided corresponding to each of the projection parts, and which is arranged side by side along the second direction in plan view, and wherein the conductor extending part and the conductor projection parts include therein the drain region side of the gate electrode and the conductive projection parts in plan view.

8. The semiconductor device according to claim 7, further comprising a conductive film connecting parts of the immediately adjacent conductor projection parts on the drain region side.

9. The semiconductor device according to claim 1, wherein the plurality of surface portions of the second-conductivity type region contact the drain region.

10. The semiconductor device according to claim 1, wherein the field insulating film further comprises a connection pattern connecting ends of the plurality of second patterns of the field insulating film to each other such that the plurality of surface portions of the second-conductivity type region are separated from the drain region by the connection pattern of the field insulating film.

11. The semiconductor device according to claim 1, wherein a thickness of the field insulating film is greater than that of the gate insulating film.

* * * * *